US012563938B2

(12) United States Patent
Bok et al.

(10) Patent No.: US 12,563,938 B2
(45) Date of Patent: Feb. 24, 2026

(54) DISPLAY APPARATUS

(71) Applicant: SAMSUNG DISPLAY CO., LTD.,
Yongin-si (KR)

(72) Inventors: Seunglyong Bok, Yongin-si (KR);
Jiyun Koo, Yongin-si (KR); **Yoona
Kim**, Yongin-si (KR)

(73) Assignee: Samsung Display Co., Ltd., Yongin-si
(KR)

( * ) Notice: Subject to any disclaimer, the term of this
patent is extended or adjusted under 35
U.S.C. 154(b) by 593 days.

(21) Appl. No.: 17/984,420

(22) Filed: Nov. 10, 2022

(65) Prior Publication Data

US 2023/0276674 A1     Aug. 31, 2023

(30) Foreign Application Priority Data

Feb. 25, 2022     (KR) ........................ 10-2022-0025502

(51) Int. Cl.
H10K 59/35          (2023.01)
(52) U.S. Cl.
CPC ......... H10K 59/353 (2023.02); H10K 59/352
(2023.02)
(58) Field of Classification Search
CPC .... H10K 59/35; H10K 59/353; H10K 59/352;
H10K 59/30; H10K 59/32; H10K 29/351;
H10K 50/11; H10K 50/805
See application file for complete search history.

(56) References Cited

U.S. PATENT DOCUMENTS

| | | | |
|---|---|---|---|
| 7,205,713 | B2 | 4/2007 | Kiguchi |
| 8,159,644 | B2 | 4/2012 | Takatori |
| 8,330,352 | B2 | 12/2012 | Sung et al. |
| 9,117,403 | B2 | 8/2015 | Omoto |
| 9,337,242 | B2 | 5/2016 | Furuie |
| 9,601,709 | B2 | 3/2017 | Kitabayashi |
| 9,679,949 | B2 | 6/2017 | Jung |
| 10,014,343 | B2 | 7/2018 | Zhang et al. |
| 10,141,380 | B2 | 11/2018 | Chung et al. |
| 10,411,075 | B2 | 9/2019 | Du |
| 10,629,655 | B2 | 4/2020 | Bai et al. |
| 10,665,640 | B2 | 5/2020 | Zhu |

(Continued)

FOREIGN PATENT DOCUMENTS

| | | |
|---|---|---|
| CN | 104576696 | 4/2015 |
| CN | 111640772 | 9/2020 |

(Continued)

*Primary Examiner* — Thanhha S Pham
(74) *Attorney, Agent, or Firm* — F. CHAU &
ASSOCIATES, LLC

(57)          ABSTRACT
A display apparatus includes a plurality of first pixels each
including a first emission layer, a plurality of second pixels
each including a second emission layer, and a plurality of
third pixels each including a third emission layer. The
plurality of first and second pixels are in a first column. A set
of a pair of first pixels and a set of a pair of second pixels
are alternately positioned in the first column. The plurality of
third pixels are in a second column and are in sets each
comprising four consecutive third pixels. The first emission
layer is integrally formed as a single body in the set of first
pixels, the second emission layer is integrally formed as a
single body in the set of second pixels, and the third
emission layer is integrally formed as a single body in each
of sets of third pixels.

5 Claims, 36 Drawing Sheets

(56)            References Cited

U.S. PATENT DOCUMENTS

| | | |
|---|---|---|
| 10,720,481 B2 | 7/2020 | Xiao et al. |
| 10,790,339 B2 | 9/2020 | Yang et al. |
| 10,854,684 B2 | 12/2020 | Huangfu et al. |
| 10,873,056 B2 | 12/2020 | Kim et al. |
| 10,901,314 B2 | 1/2021 | Ji |
| 10,909,901 B2 | 2/2021 | Wu et al. |
| 2009/0121983 A1 | 5/2009 | Sung et al. |
| 2015/0102297 A1 | 4/2015 | Lee |
| 2018/0166510 A1 | 6/2018 | Lee |
| 2020/0058713 A1 | 2/2020 | Zhang |
| 2020/0168674 A1* | 5/2020 | Tan ...................... H10K 59/353 |
| 2020/0203448 A1 | 6/2020 | Kim et al. |
| 2020/0212148 A1 | 7/2020 | Youn et al. |

FOREIGN PATENT DOCUMENTS

| | | |
|---|---|---|
| JP | 5811709 | 10/2015 |
| KR | 10-2009-0049515 A | 5/2009 |
| KR | 10-2015-0042009 A | 4/2015 |
| KR | 10-2016-0113378 | 9/2016 |
| KR | 10-2017-0124071 | 11/2017 |
| KR | 10-2018-0068560 A | 6/2018 |
| KR | 10-2018-0085862 | 7/2018 |
| KR | 10-2020-0079121 | 7/2020 |
| KR | 10-2020-0082729 A | 7/2020 |
| KR | 10-2211965 | 2/2021 |

\* cited by examiner

P31

P11
P21

US y z ⊙ ——▶ x

1

DISPLAY APPARATUS

CROSS-REFERENCE TO RELATED APPLICATION

This application claims priority under 35 U.S.C. § 119 to Korean Patent Application No. 10-2022-0025502, filed on Feb. 25, 2022 in the Korean Intellectual Property Office, the disclosure of which is incorporated by reference in its entirety herein.

1. TECHNICAL FIELD

One or more embodiments relate to a display apparatus, and more particularly, to a display apparatus having an increased emission area and deposition efficiency during a manufacturing process.

2. DISCUSSION OF RELATED ART

An organic light-emitting display apparatus is a display apparatus that generates images through light emitted from an emission layer that is positioned between a pixel electrode and an opposite electrode. The organic light-emitting display apparatus controls a pixel electrode that is electrically connected to a thin-film transistor and an electrical signal applied to the pixel electrode through the thin-film transistor to control whether each pixel emits light and the degree of light emission.

SUMMARY

In an organic light-emitting display apparatus of the related art, the size of a sub-pixel decreases due to an increasing demand for high resolution, and accordingly, the sub-pixel has difficulties emitting light of sufficient luminance.

According to one or more embodiments of the present inventive concept, a display apparatus has an increased emission area and a deposition efficiency may be increased during a manufacturing process. However, this is only an example, and the scope of embodiments of the present inventive concept are not necessarily limited thereto.

Additional aspects will be set forth in part in the description which follows and, in part, will be apparent from the description, or may be learned by practice of embodiments of the present inventive concept.

According to an embodiment of the present inventive concept, a display apparatus includes a plurality of first pixels each including a first pixel electrode and a first emission layer. The first emission layer is disposed over the first pixel electrode and emits a first color light. A plurality of second pixels each includes a second pixel electrode and a second emission layer. The second emission layer is disposed over the second pixel electrode and emits a second color light. A plurality of third pixels each includes a third pixel electrode and a third emission layer. The third emission layer is disposed over the third pixel electrode and emits a third color light. The plurality of first pixels and the plurality of second pixels are positioned in a first column. A set of a pair of first pixels and a set of a pair of second pixels are alternately positioned in the first column. The plurality of third pixels are positioned in a second column and are arranged in sets each comprising four consecutive third pixels in the second column. The first emission layer is integrally formed as a single body in the set of the pair of first pixels. The second emission layer is integrally formed as a single body in the set of the pair of second pixels. The third emission layer is integrally formed as a single body in each of the sets of four consecutive third pixels.

In an embodiment, an area of each of the plurality of third pixels may be greater than an area of each of the plurality of first pixels and an area of each of the plurality of second pixels.

In an embodiment, a separation distance between first pixels in the set of the pair of first pixels may be less than a separation distance between the set of the pair of first pixels and the set of the pair of second pixels.

In an embodiment, a separation distance between second pixels in the set of the pair of second pixels may be less than a separation distance between the set of the pair of first pixels and the set of the pair of second pixels.

In an embodiment, a separation distance between third pixels in each of the sets of four consecutive third pixels may be less than a separation distance between adjacent sets of the third pixels.

According to an embodiment of the present inventive concept, a display apparatus includes a plurality of first pixels each comprising a first pixel electrode and a first emission layer. The first emission layer is disposed over the first pixel electrode and emits a first color light. A plurality of second pixels each comprises a second pixel electrode and a second emission layer. The second emission layer is disposed over the second pixel electrode and emits a second color light. A plurality of third pixels each comprises a third pixel electrode and a third emission layer. The third emission layer is disposed over the third pixel electrode and emits a third color light. The plurality of first pixels and the plurality of second pixels are positioned in a first column. A first pixel of the plurality of first pixels and a second pixel of the plurality of second pixels are alternately positioned in the first column. The plurality of third pixels are positioned in a second column and are arranged in sets each comprising three consecutive third pixels. The third emission layer is integrally formed as a single body in each of the sets of third pixels.

In an embodiment, an area of each of the plurality of third pixels may be greater than an area of each of the plurality of first pixels and an area of each of the plurality of second pixels.

In an embodiment, a separation distance between third pixels in each of the sets comprising three consecutive third pixels may be less than a separation distance between adjacent sets of the third pixels.

According to an embodiment of the present inventive concept, a display apparatus includes a plurality of first pixels each comprising a first pixel electrode and a first emission layer. The first emission layer is disposed over the first pixel electrode and emits a first color light. A plurality of second pixels each comprises a second pixel electrode and a second emission layer. The second emission layer is disposed over the second pixel electrode and emits a second color light. A plurality of third pixels each comprises a third pixel electrode and a third emission layer. The third emission layer is disposed over the third pixel electrode and emits a third color light. The plurality of second pixels are positioned in a first column extending in a first direction. The plurality of third pixels are positioned in a second column extending in the first direction. The plurality of first pixels are positioned in rows extending in a second direction crossing the first direction. A first pixel of the plurality of first pixels is disposed between adjacent second pixels of the plurality of second pixels or between adjacent third pixels of the plurality of third pixels.

In an embodiment, an area of each of the plurality of third pixels may be greater than an area of each of the plurality of first pixels and an area of each of the plurality of second pixels.

In an embodiment, the plurality of second pixels are arranged in sets each comprising a pair of second pixels. The rows may be positioned between adjacent sets of second pixels.

In an embodiment, in each of the rows, the plurality of first pixels are arranged in sets each comprising a pair of first pixels. The first emission layer may be integrally formed as a single body in each of the sets of first pixels.

In an embodiment, a separation distance between first pixels in the sets of first pixels may be less than a separation distance between adjacent sets of first pixels.

According to an embodiment of the present inventive concept, a display apparatus includes a plurality of first pixels each comprising a first pixel electrode and a first emission layer. The first emission layer is disposed over the first pixel electrode and emits a first color light. A plurality of second pixels each comprises a second pixel electrode and a second emission layer. The second emission layer is disposed over the second pixel electrode and emits a second color light. A plurality of third pixels each comprises a third pixel electrode and a third emission layer. The third emission layer is disposed over the third pixel electrode and emits a third color light. The plurality of third pixels are positioned on grid points at regular intervals in a first direction and a second direction. The second direction is perpendicular to the first direction. The plurality of first pixels and the plurality of second pixels are disposed between the plurality of third pixels in inclined columns extending in a third direction at an angle of 45° from the first direction. The plurality of first pixels are arranged in a first inclined column of the inclined columns. The plurality of second pixels are arranged are in a second inclined column of the inclined columns. The first and second inclined columns are alternately arranged. Two first pixels are disposed between adjacent third pixels in each of the first inclined columns. Two second pixels are disposed between adjacent third pixels in each of the second inclined columns.

In an embodiment, the two first pixels may be arranged in a fourth direction perpendicular to the third direction, and the two second pixels may be arranged in the third direction.

In an embodiment, the first emission layer may be integrally formed as a single body in the two first pixels, and the second emission layer may be integrally formed as a single body in the two second pixels.

In an embodiment, an area of each of the plurality of third pixels may be about twice an area of each of the plurality of first pixels.

In an embodiment, an area of each of the plurality of third pixels may be about twice an area of each of the plurality of second pixels.

According to an embodiment of the present inventive concept, a display apparatus includes a plurality of first pixels each including a first pixel electrode and a first emission layer. The first emission layer is disposed over the first pixel electrode and emits a first color light. A plurality of second pixels each includes a second pixel electrode and a second emission layer. The second emission layer is disposed over the second pixel electrode and emits a second color light. A plurality of third pixels each includes a third pixel electrode and a third emission layer. The third emission layer is disposed over the third pixel electrode and emits a third color light. A set of a pair of second pixels and a set of a pair of third pixels are alternately positioned in a first direction. A set of a pair of first pixels and the set of the pair of third pixels are alternately positioned in a second direction crossing the first direction.

In an embodiment, the first color light may be red light, the second color light may be green light, and the third color light may be blue light.

These and/or other aspects will become apparent and more readily appreciated from the following description of embodiments of the present inventive concept, the accompanying drawings, and claims.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION OF EMBODIMENTS

Figure 1:
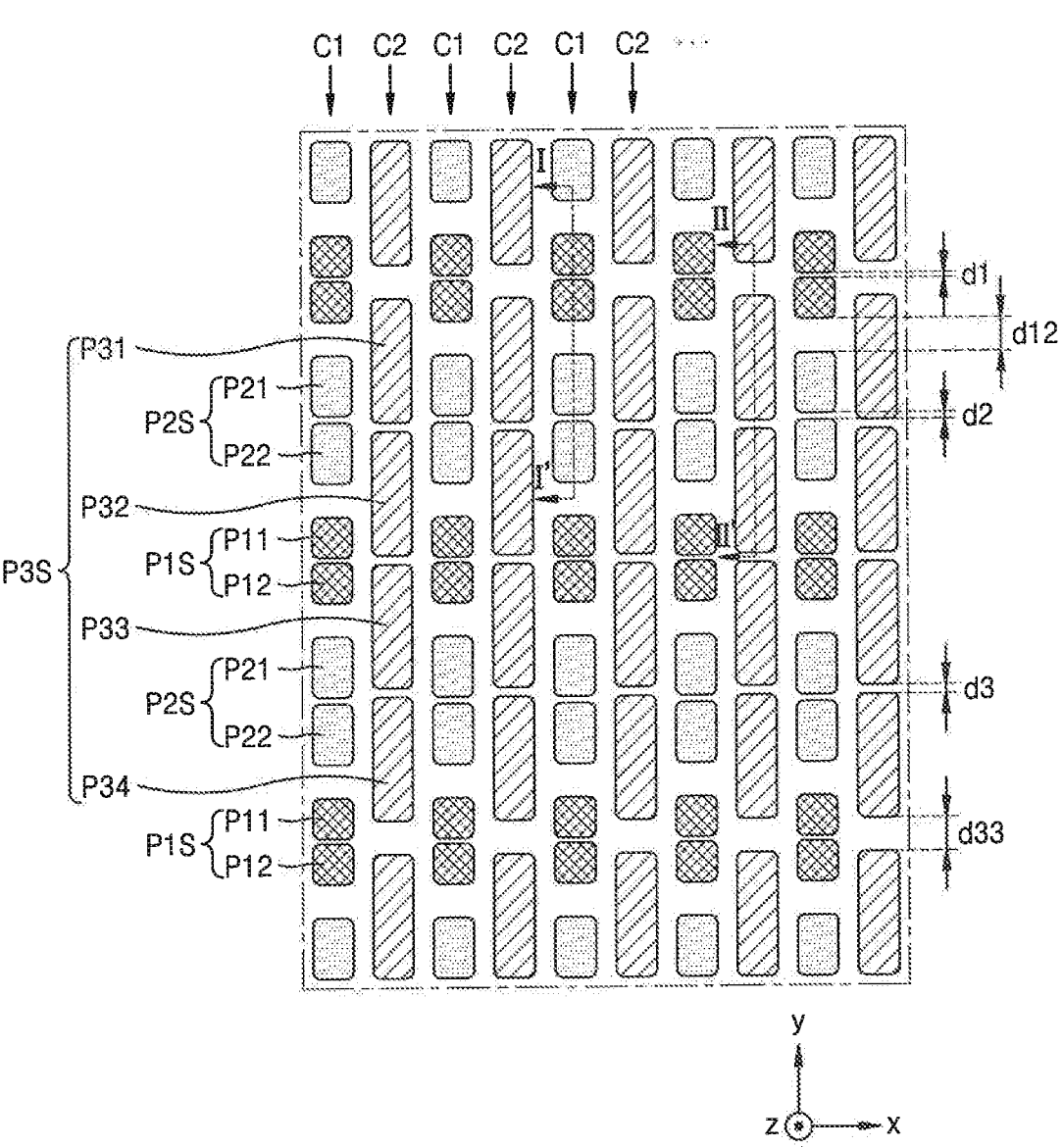
FIG. 1 is a schematic view of an arrangement of pixels of a display apparatus according to an embodiment of the present inventive concept.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, embodiments are merely described below, by referring to the figures, to explain aspects of the present description. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or variations thereof.

As the disclosure allows for various changes and numerous embodiments, embodiments will be illustrated in the drawings and described in detail in the written description. Effects and features of the disclosure, and methods for achieving them will be clarified with reference to embodiments described below in detail with reference to the drawings. However, the disclosure is not limited to the following embodiments and may be embodied in various forms.

Hereinafter, the disclosure will be described in detail by explaining embodiments of the disclosure with reference to the attached drawings. Like reference numerals in the drawings denote like elements.

It will be understood that when a layer, region, or element is referred to as being "formed on" another layer, area, or element, it can be directly or indirectly formed on the other layer, region, or element. For example, intervening layers, regions, or elements may be present. When a layer, region, or element is referred to as being "formed directly on" another layer, area, or element, no intervening layers, regions, or elements may be present. Sizes of elements in the drawings may be exaggerated for convenience of explanation. For example, because sizes and thicknesses of elements in the drawings may be arbitrarily illustrated for convenience of description, embodiments of the present inventive concept are not necessarily limited thereto.

In embodiments below, the x-axis, the y-axis and the z-axis are not limited to three axes of the rectangular coordinate system, and may be interpreted in a broader sense. For example, the x-axis, the y-axis, and the z-axis may be perpendicular to one another or may represent different directions that are not perpendicular to one another.

Figure 2:
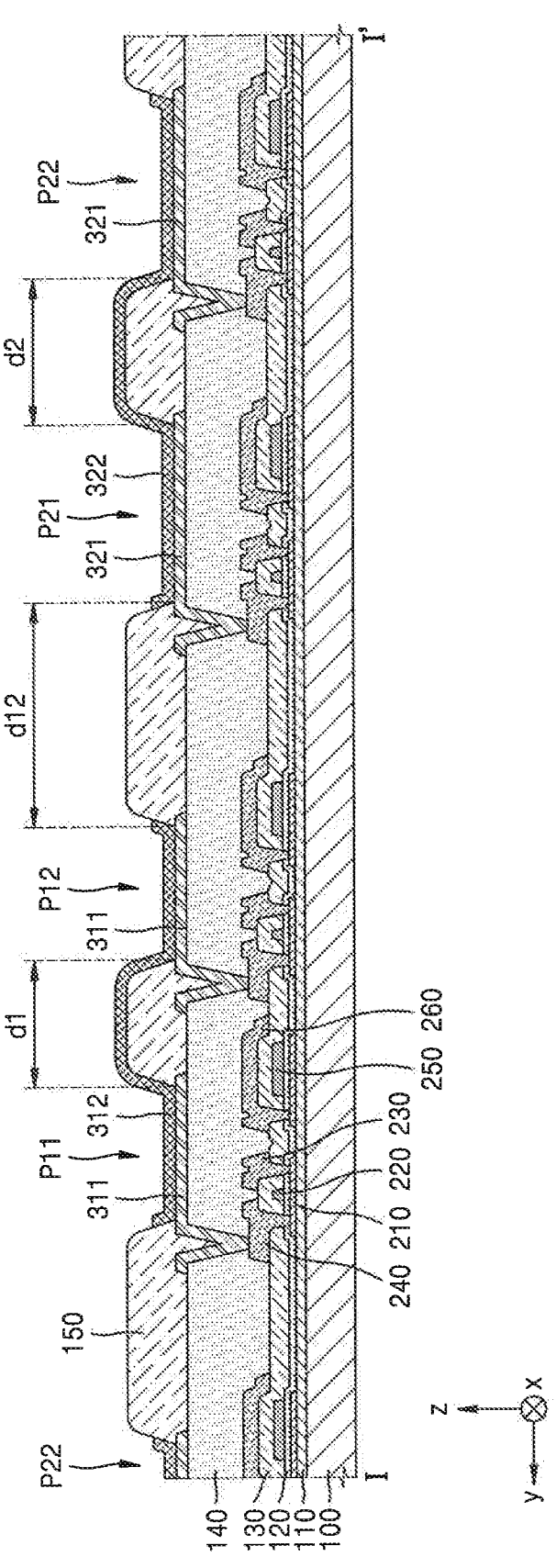
FIG. 2 is a schematic cross-sectional view taken along a line I-I of FIG. 1 illustrating a display apparatus according to an embodiment of the present inventive concept.
Figure 3:
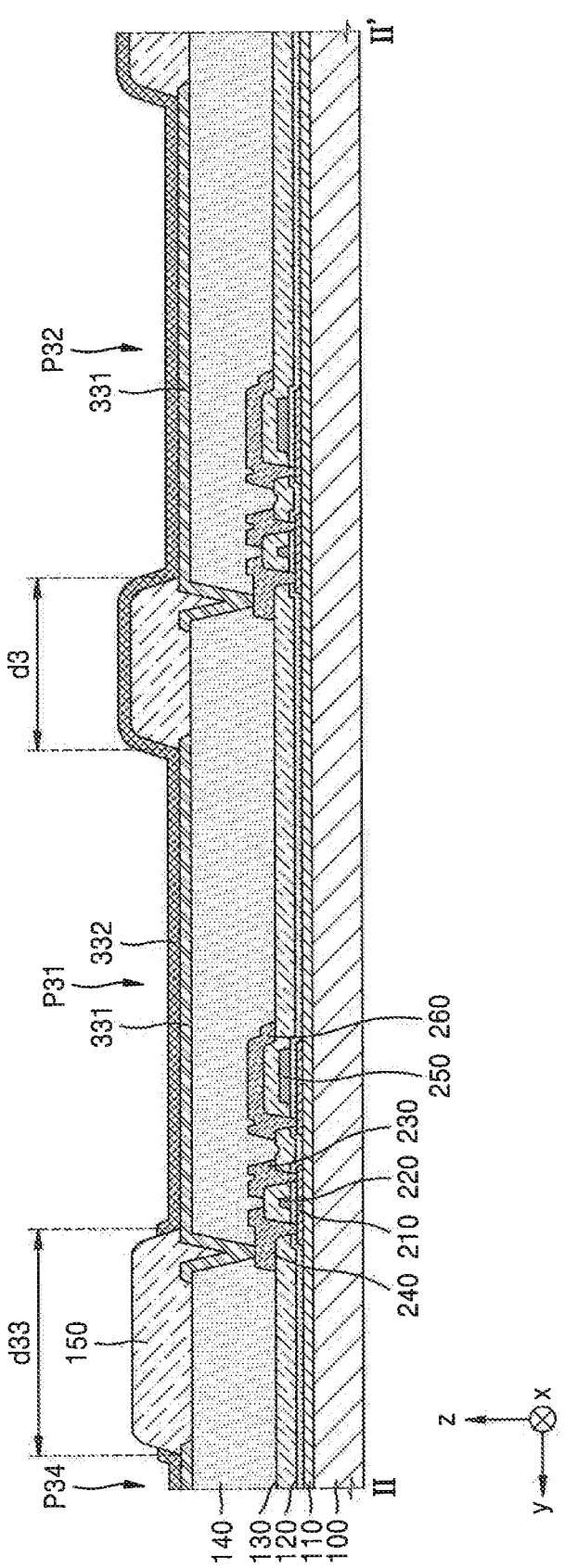
FIG. 3 is a schematic cross-sectional view taken along a line II-II' of FIG. 1 illustrating a display apparatus according to an embodiment of the present inventive concept.

FIG. 1 is a schematic conceptual view of an arrangement of pixels of a display apparatus, according to an embodiment, FIG. 2 is a schematic cross-sectional view illustrating a cross-section of the display apparatus taken along a line I-I' of FIG. 1, and FIG. 3 is a schematic cross-sectional view illustrating a cross-section of the display apparatus taken along a line II-II' of FIG. 1.

The display apparatus according to an embodiment includes a plurality of first pixels P11 and P12, a plurality of second pixels P21 and P22, and a plurality of third pixels P31, P32, P33, and P34. Such pixels may be defined by various elements on a substrate 100. For example, as shown in FIGS. 2 and 3, a first pixel electrode 311, a second pixel electrode 321, and a third pixel electrode 331 are disposed on a planarization layer 140, and a pixel-defining layer 150 is disposed on the pixel electrodes. In an embodiment, the pixel-defining layer 150 may include an opening exposing a central portion of each of the pixel electrodes and may cover lateral edges of each of the pixel electrodes. Pixels shown in FIG. 1 may correspond to openings of the pixel-defining layer 150. For example, portions of first pixel electrodes 311 exposed by the openings of the pixel-defining layer 150 may be referred to as the first pixels P11 and P12, portions of second pixel electrodes 321 exposed by the openings of the pixel-defining layer 150 may be referred to as the second pixels P21 and P22, and portions of third pixel electrodes 331 exposed by the openings of the pixel-defining layer 150 may be referred to as the third pixels P31 and P32.

The emission of light by the pixels may be controlled by a thin-film transistor electrically connected to the pixels. In FIGS. 2 and 3, it is shown that a thin-film transistor and a capacitor are arranged in each pixel, the thin-film transistor including a semiconductor layer 210, a gate electrode 220, a source electrode 230, and a drain electrode 240, and the capacitor including a lower electrode 250 and an upper electrode 260. In addition, in FIGS. 2 and 3, it is shown that the first pixel electrode 311, the second pixel electrode 321, and the third pixel electrode 331 are electrically connected to a drain electrode 240 of a thin-film transistor corresponding thereto. However, this is an example, and one or more embodiments are not necessarily limited thereto and various modifications are possible. For example, the thin-film transistor may include any one of the source electrode 230 and the drain electrode 240. In this embodiment, a source region or a drain region of the semiconductor layer 210 may serve as a source electrode or a drain electrode of the thin-film transistor. Also, when a plurality of thin-film transistors are provided, a drain region of a first thin-film transistor may be connected to a source region of a second thin-film transistor. In this embodiment, the first thin-film transistor may not include the drain electrode, and the second thin-film transistor may not include the source electrode.

Such thin-film transistors are disposed on the substrate 100. In an embodiment, the substrate 100 may include glass, metal, or a polymer resin. Alternatively, when at least a portion of the display apparatus is bent, the substrate 100 may be flexible or bendable. In this embodiment, the substrate 100 may include, e.g., a polymer resin, such as polyethersulphone, polyacrylate, polyetherimide, polyethylene naphthalate, polyethylene terephthalate, polyphenylene sulfide, polyarylate, polyimide, polycarbonate, or cellulose acetate propionate. However, the substrate 100 may be variously modified. For example, the substrate 100 may have a multi-layered structure including two layers each including a polymer resin and a barrier layer including an inorganic material, such as silicon oxide, silicon nitride, or silicon oxynitride, between the two layers.

A buffer layer 110 may be disposed on the substrate 100. In an embodiment, the buffer layer 110 may include silicon oxide, silicon nitride, or silicon oxynitride. The buffer layer 110 may planarize the upper surface of the substrate 100. In an embodiment, the semiconductor layer 210 on the buffer layer 110 may include amorphous silicon or polysilicon. In an embodiment, the semiconductor layer 210 may include an oxide semiconductor material.

A gate insulating layer 120 may cover the semiconductor layer 210 and may be disposed over the substrate 100. The gate insulating layer 120 may include an insulating material. For example, in an embodiment the gate insulating layer 120 may include an inorganic insulating material, such as silicon oxide, silicon nitride, silicon oxynitride, or aluminum oxide. However, embodiments of the present inventive concept are not necessarily limited thereto.

The gate electrode 220 and/or the lower electrode 250 of the capacitor may be disposed on the gate insulating layer 120. In an embodiment in which the gate electrode 220 and the lower electrode 250 are disposed on the gate insulating layer 120, the gate electrode 220 and the lower electrode 250 may have the same layer structure and may include the same material. For example, each of the gate electrode 220 and the lower electrode 250 may include a layer including molybdenum (Mo) and a layer including aluminum (Al) and may have a two-layered structure including Mo/Al or a three-layered structure including Mo/Al/Mo.

An interlayer insulating layer 130 may cover the gate electrode 220 and the lower electrode 250 and may be disposed on the gate insulating layer 120. The interlayer insulating layer 130 may include an insulating material. For example, in an embodiment the interlayer insulating layer 130 may include silicon oxide, silicon nitride, silicon oxynitride, or aluminum oxide. However, embodiments of the present inventive concept are not necessarily limited thereto.

The source electrode 230, the drain electrode 240, and/or the upper electrode 260 of the capacitor may be disposed on the interlayer insulating layer 130. In an embodiment, the source electrode 230, the drain electrode 240, and the upper electrode 260 may have the same layer structure and may include the same material. For example, each of the source electrode 230, the drain electrode 240, and the upper electrode 260 may include a layer including titanium (Ti) and a layer including Al and may have a three-layered structure including Ti/Al/Ti. However, embodiments of the present inventive concept are not necessarily limited thereto.

The planarization layer 140 may cover the source electrode 230, the drain electrode 240, and the upper electrode 260 and may be disposed on the interlayer insulating layer 130. The planarization layer 140 may include an organic insulating material. For example, in an embodiment the planarization layer 140 may include photoresist, benzocyclobutene (BCB), polyimide, hexamethyldisiloxane (HMDSO), polymethylmethacrylate (PMMA), polystyrene, a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof. For example, the planarization layer 140 may include a polyimide layer having a thickness of about 1.6 m. However, embodiments of the present inventive concept are not necessarily limited thereto.

An organic light-emitting element may be disposed on the planarization layer 140. The organic light-emitting element may include a pixel electrode, an emission layer, and an opposite electrode. Pixel electrodes of organic light-emitting elements may be spaced apart from each other, and the opposite electrode may be integrally formed as a single body in the organic light-emitting elements. The emission layer may have a patterned shape to correspond to the pixel electrodes. In an embodiment, a first functional layer, such as a hole transport layer (HTL) and/or a hole injection layer (HIL), may be between the pixel electrode and the emission layer, and a second functional layer, such as an electron transport layer and/or an electron injection layer (EIL), may be between the emission layer and the opposite electrode. The first functional layer and/or the second functional layer may be integrally formed as a single body in the organic light-emitting elements. In FIGS. 2 and 3, the first functional layer, the second functional layer, and the opposite electrode are omitted for convenience of explanation.

The pixel-defining layer 150 described above may be disposed on the planarization layer 140 to cover edges of the pixel electrodes. In an embodiment, the pixel-defining layer 150 may include one or more organic insulating materials selected from the group consisting of polyimide, polyamide, acryl resin, benzo cyclobutene, and phenol resin, and may be manufactured by a spin coating method or the like.

The pixel electrode on the planarization layer 140 may be a (semi-)transmissive electrode or a reflective electrode. For example, in an embodiment the pixel electrode may include a reflective layer including silver (Ag), magnesium (Mg), Al, platinum (Pt), palladium (Pd), gold (Au), nickel (Ni), neodymium (Nd), iridium (Ir), chromium (Cr), and a compound thereof, and a transparent or semi-transparent electrode layer on the reflective layer. The transparent or semi-transparent electrode layer may include at least one selected from the group consisting of indium tin oxide (ITO), indium zinc oxide (IZO), zinc oxide (ZnO or $ZnO_2$), indium oxide ($In_2O_3$), indium gallium oxide (IGO), and aluminum zinc oxide (AZO). For example, the pixel electrode may have a three-layered structure including ITO/Ag/ITO.

The opposite electrode integrally formed as a single body to correspond to the plurality of pixel electrodes may be a transmissive electrode or a reflective electrode. For example, in an embodiment the opposite electrode may be a transparent or semi-transparent electrode, and may include a metal thin film including lithium (Li), calcium (Ca), lithium fluoride (LiF), Al, Ag, Mg, and a compound thereof having a small work function. Also, the opposite electrode may include a transparent or semi-transparent electrode layer on the metal thin film. In this embodiment, the transparent or semi-transparent electrode may include at least one selected from the group consisting of ITO, IZO, ZnO or $ZnO_2$, $In_2O_3$, IGO, and AZO. In an embodiment, the opposite electrode may be integrally formed as a single body extending to a plurality of pixels and may be disposed over the emission layer and the pixel-defining layer 150.

Each of the first pixels P11 and P12 includes a first pixel electrode 311, and a first emission layer 312 disposed over the first pixel electrode 311 and emitting a first color light. In an embodiment, the first color light may be, e.g., red light. Each of the second pixels P21 and P22 may include a second pixel electrode 321, and a second emission layer 322 disposed over the second pixel electrode 321 and emitting a second color light. In an embodiment, the second color light may be, e.g., green light. Each of the third pixels P31 and P32 may include a third pixel electrode 331, and a third emission layer 332 disposed over the third pixel electrode 331 and emitting a third color light. In an embodiment, the third color light may be, e.g., blue light. However, embodiments of the present inventive concept are not necessarily limited thereto and the colors of the first to third color lights may vary.

As shown in FIG. 1, the plurality of first pixels P11 and P12 and the plurality of second pixels P21 and P22 are positioned in a first column C1 extending in a first direction (+y direction). In an embodiment, a set P1S of a pair of first pixels P11 and P12 and a set P2S of a pair of second pixels P21 and P22 are alternately positioned in the first column C1. In addition, the plurality of third pixels P31, P32, P33, and P34 are positioned in a second column C2 parallel to the first column C1. The first column C1 and the second column C2 may be alternately positioned in a second direction (+x direction) crossing the first direction (+y direction).

In an embodiment, the area (e.g., in the first and second directions +x, +y) of each of the third pixels P31, P32, P33, and P34 may be greater than the area (e.g., in the first and second directions +x, +y) of each of the first pixels P11 and P12 and the area (e.g., in the first and second directions +x, +y) of each of the second pixels P21 and P22. In a comparative embodiment in which the areas are equal to each other, the emission efficiency of the third emission layer 332 emitting the third color light that is blue light is less than the emission efficiency of the first emission layer 312 emitting the first color light that is red light and the emission efficiency of the second emission layer 322 emitting the second color light that is green light.

As described above, the set P1S of the pair of first pixels P11 and P12 and the set P2S of the pair of second pixels P21 and P22 are alternately positioned (e.g., arranged) in the first column C1. In this embodiment, the first emission layer 312 may be integrally formed as a single body in the set P1S of the pair of first pixels P11 and P12, and the second emission layer 322 may be integrally formed as a single body in the set P2S of the pair of second pixels P21 and P22. In addition, the third emission layer 332 may be integrally formed as a single body in each of sets P3S of four consecutive third pixels P31, P32, P33, and P34 among the plurality of third pixels.

Each pixel should secure a sufficient emission area to implement a high-quality display apparatus capable of displaying high-luminance images. For example, as the emission area increases, light of higher luminance may be emitted. In the display apparatus according to an embodiment, the first emission layer 312 is integrally formed as a single body in the set P1S of the pair of first pixels P11 and P12, and accordingly, by reducing a separation distance d1 between the first pixels P11 and P12 included in the set P1S, the area of the first pixel electrodes 311 may be increased, such that the first pixels P11 and P12 may secure a sufficient emission area. In addition, in an embodiment in which the first emission layer 312 is formed in a predetermined area by a deposition method or the like, as the predetermined area decreases, deposition efficiency is reduced. In the display apparatus according to an embodiment, the first emission layer 312 is integrally formed as a single body in the set P1S of the pair of first pixels P11 and P12, and thus, deposition efficiency during the formation of the first emission layer 312 may be significantly increased.

This also applies to the second pixels P21 and P22. In the display apparatus according to an embodiment, the second emission layer 322 is integrally formed as a single body in the set P2S of the pair of second pixels P21 and P22, and accordingly, by reducing a separation distance d2 between the second pixels P21 and P22 included in the set P2S, the area of the second pixel electrodes 321 may be increased, such that the second pixels P21 and P22 may secure a sufficient emission area. In addition, the second emission layer 322 is integrally formed as a single body in the set P2S of the pair of second pixels P21 and P22, and thus, deposition efficiency during the formation of the second emission layer 322 may be significantly increased.

This also applies to the third pixels P31, P32, P33, and P34. In the display apparatus according to an embodiment, the third emission layer 332 is integrally formed as a single body in a set P3S of the four consecutive third pixels P31, P32, P33, and P34, and accordingly, by reducing a separation distance d3 between the third pixels P31, P32, P33, and P34 included in the set P3S, the area of the third pixel electrodes 331 may be increased, such that the third pixels P31, P32, P33, and P34 may secure a sufficient emission area. In addition, the third emission layer 332 is integrally formed as a single body in the set P3S of the four consecutive third pixels P31, P32, P33, and P34, and thus, deposition efficiency during the formation of the third emission layer 332 may be significantly increased.

As described above, in the display apparatus according to an embodiment, the separation distance d1 between the first pixels P11 and P12 included in the set P1S and the separation distance d2 between the second pixels P21 and P22 included in the set P2S may be reduced. In an embodiment, the separation distance d1 between the first pixels P11 and P12 in the set P1S of the pair of first pixels P11 and P12 may be less than a separation distance d12 between the set P1S of the pair of first pixels P11 and P12 and the set P2S of the pair of second pixels P21 and P22. Similarly, the separation distance d2 between the second pixels P21 and P22 in the set P2S of the pair of second pixels P21 and P22 may be less than the separation distance d12 between the set P1S of the pair of first pixels P11 and P12 and the set P2S of the pair of second pixels P21 and P22.

Similarly, in the display apparatus according to an embodiment, the separation distance d3 between the third pixels P31, P32, P33, and P34 included in the set P3S may be reduced. In an embodiment, the separation distance d3 between the third pixels P31, P32, P33, and P34 in each of the sets P3S of the four consecutive third pixels P31, P32, P33, and P34 may be less than a separation distance d33 between the adjacent sets P3S of the four consecutive third pixels P31, P32, P33, and P34.

Figure 4:
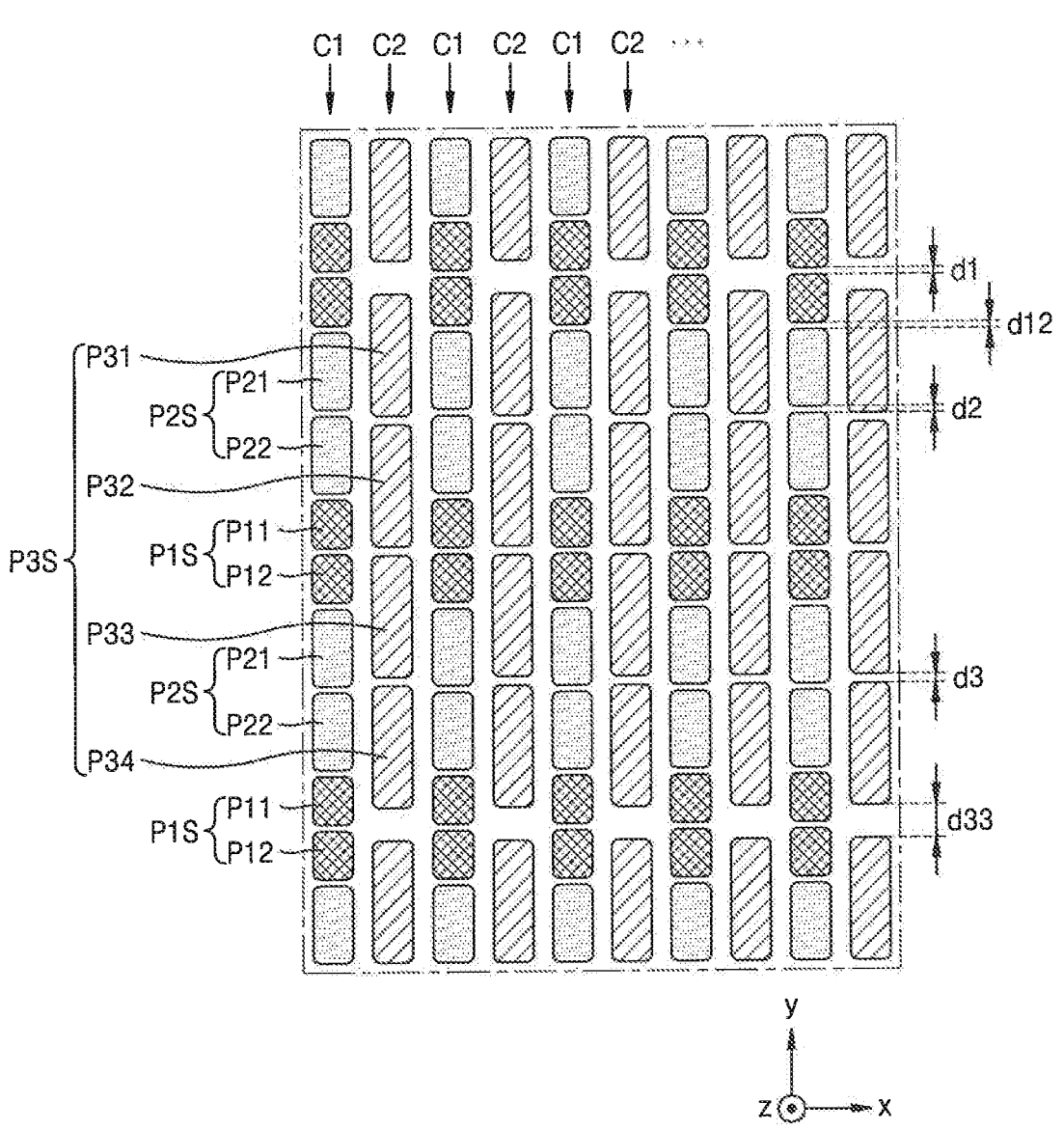
FIG. 4 is a schematic conceptual view of an arrangement of pixels of a display apparatus according to an embodiment of the present inventive concept.

However, one or more embodiments of the present inventive concept are not necessarily limited thereto. For example, as shown in FIG. 4, which is a schematic conceptual view of an arrangement of pixels of the display apparatus, according to an embodiment, the separation distance d1 between the first pixels P11 and P12 included in the set P1S may also be equal to the separation distance d12 between the set P1S of the pair of first pixels P11 and P12 and the set P2S of the pair of second pixels P21 and P22. In addition, the separation distance d2 between the second pixels P21 and P22 included in the set P2S may also be equal to the separation distance d12 between the set P1S of the pair of first pixels P11 and P12 and the set P2S of the pair of second pixels P21 and P22.

Figure 5:
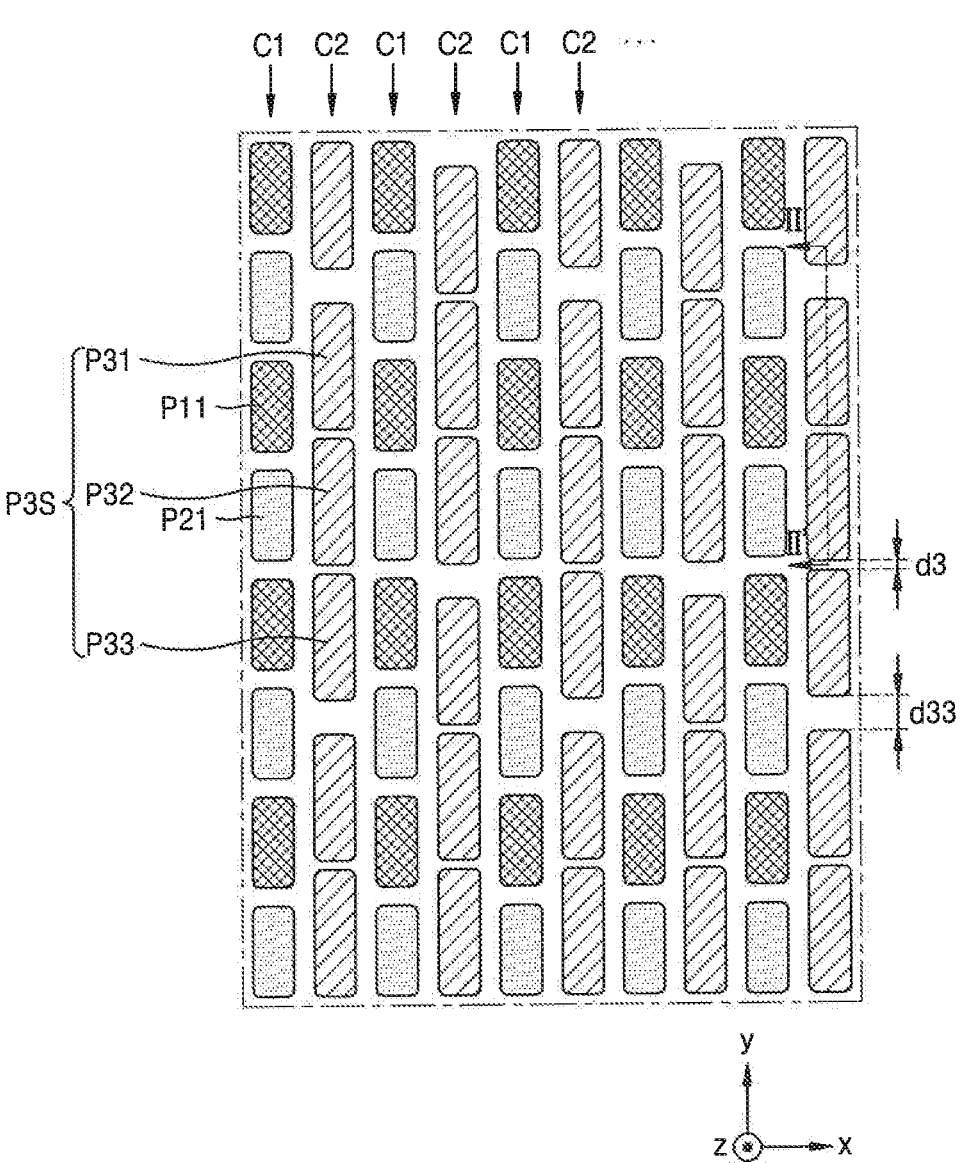
FIG. 5 is a schematic conceptual view of an arrangement of pixels of a display apparatus according to an embodiment of the present inventive concept.

FIG. 5 is a schematic conceptual view of an arrangement of pixels of the display apparatus, according to an embodiment. In a display apparatus according to an embodiment, a first pixel P11 emitting the first color light and a second pixel P21 emitting the second color light are alternately positioned in the first column C1 extending in the first direction (+y direction), and third pixels P31, P32, and P33 capable of emitting the third color light are positioned in the second column C2 extending in the first direction (+y direction). In addition, the third emission layer 332 may be integrally formed as a single body in each of sets P3S of three consecutive third pixels P31, P32, and P33 in the first direction (+y direction). The first column C1 and the second column C2 may be alternately positioned in the second direction (+x direction) crossing the first direction (+y direction).

In an embodiment, the area (e.g., in the first and second directions +x, +y) of each of the third pixels P31, P32, and P33 may be greater than the area (e.g., in the first and second directions +x, +y) of each of the first pixels P11 and the area of each of the second pixels P21. In a comparative embodiment in which the areas are equal to each other, the emission efficiency of the third emission layer 332 emitting the third color light that is blue light is less than the emission efficiency of the first emission layer 312 emitting the first color light that is red light and the emission efficiency of the second emission layer 322 emitting the second color light that is green light.

In the display apparatus according to an embodiment, the third emission layer 332 is integrally formed as a single body in the set P3S of the three consecutive third pixels P31, P32, and P33, and accordingly, by reducing a separation distance d3 between the third pixels P31, P32, and P33 included in the set P3S, the area of the third pixel electrodes 331 may be increased, such that the third pixels P31, P32, and P33 may secure a sufficient emission area. In addition, the third emission layer 332 is integrally formed as a single body in the set P3S of the three consecutive third pixels P31, P32, and P33, and thus, deposition efficiency during the formation of the third emission layer 332 may be significantly increased.

As described above, in the display apparatus according to an embodiment, the separation distance d3 between the third pixels P31, P32, and P33 included in the set P3S may be reduced. In an embodiment, the separation distance d3 between the third pixels P31, P32, and P33 in each of the sets P3S of the three consecutive third pixels P31, P32, and P33 may be less than a separation distance d33 between the sets P3S of the three consecutive third pixels P31, P32, and P33.

Figure 6:
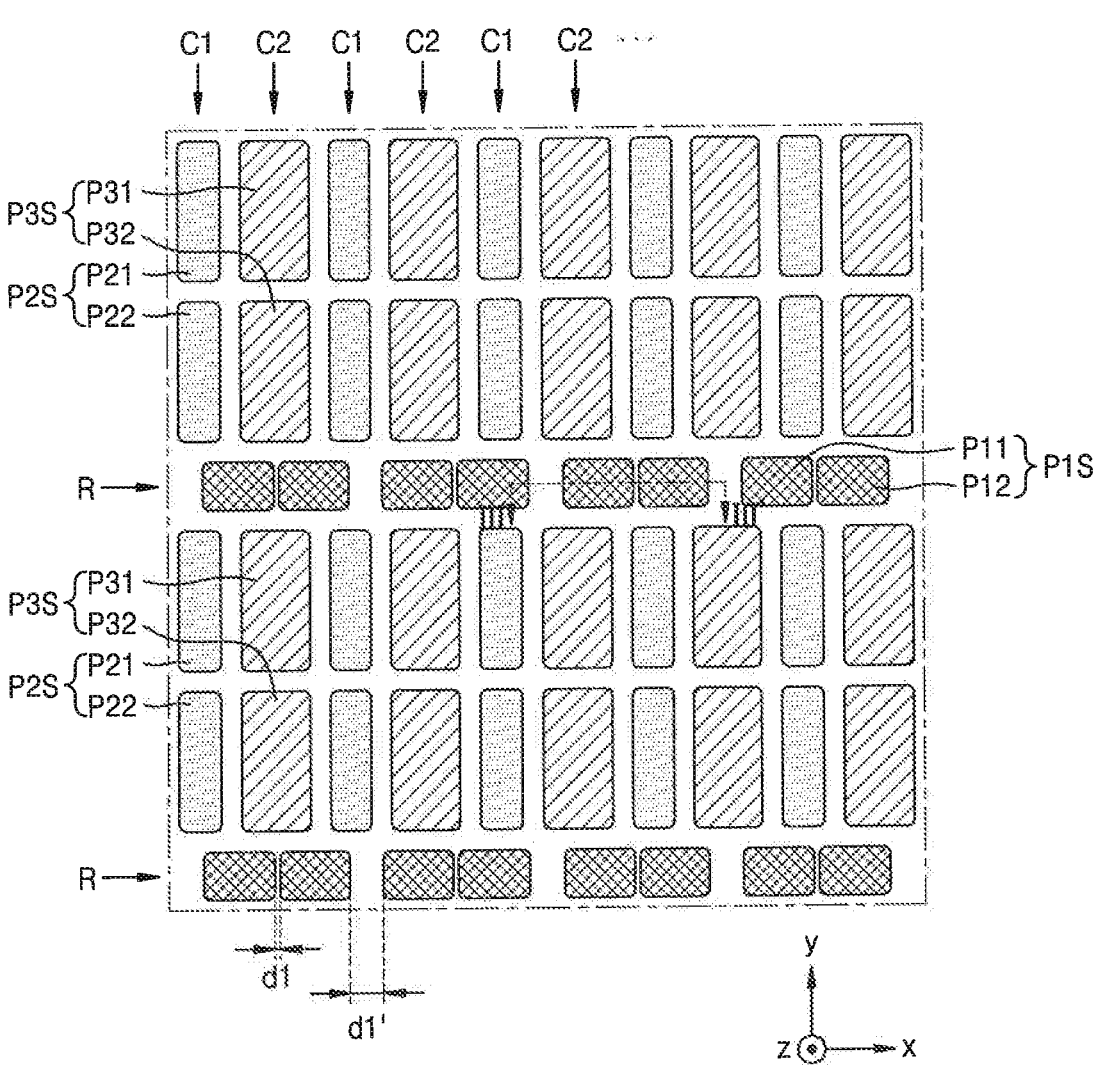
FIG. 6 is a schematic conceptual view of an arrangement of pixels of a display apparatus, according to an embodiment of the present inventive concept.
Figure 7:
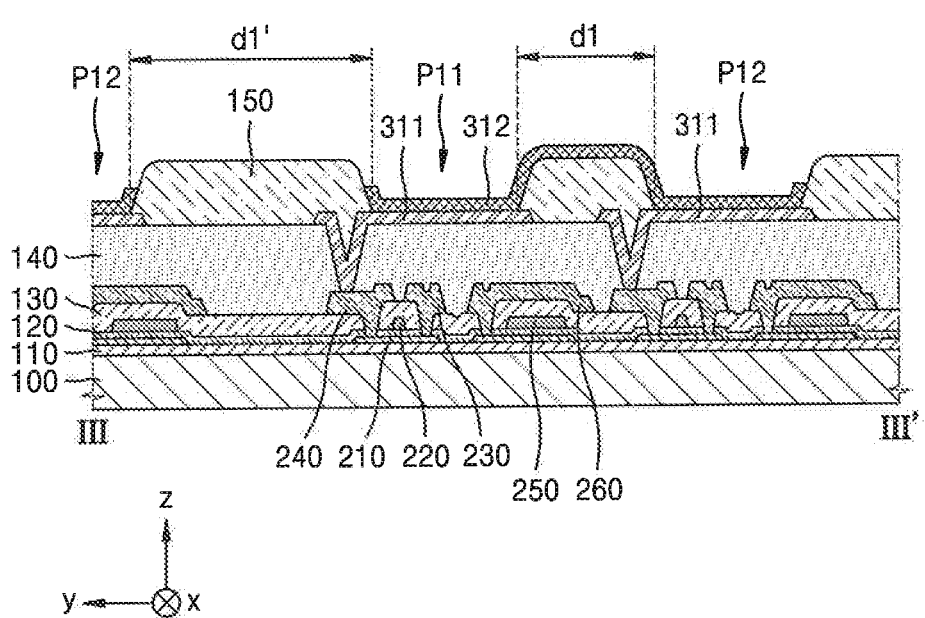
FIG. 7 is a schematic cross-sectional view taken along a line III-III' of FIG. 6 illustrating a display apparatus according to an embodiment of the present inventive concept.

FIG. 6 is a schematic conceptual view of an arrangement of pixels of the display apparatus, according to an embodiment, and FIG. 7 is a schematic cross-sectional view illustrating a cross-section of the display apparatus taken along a line III-III' of FIG. 6. In the display apparatus according to an embodiment, second pixels P21 and P22 emitting the second color light are positioned in the first column C1 extending in the first direction (+y direction), and similarly, third pixels P31 and P32 emitting the third color light are positioned in the second column C2 extending in the first direction (+y direction). The first column C1 and the second column C2 may be alternately positioned in the second direction (+x direction) crossing the first direction (+y direction). In addition, first pixels P11 and P12 emitting the first color light are positioned in rows R extending in the second direction (+x direction) crossing the first direction (+y direction) so that the first pixels P11 and P12 are between the neighboring second pixels P21 and P22 and/or between the neighboring third pixels P31 and P32 (e.g., in the first direction +y).

The area of each of the third pixels P31 and P32 (e.g., in the first and second directions +x, +y) may be greater than the area of each of the first pixels P11 and P12 and the area of each of the second pixels P21 and P22 (e.g., in the first and second directions +x, +y). In a comparative embodiment in which the areas are equal to each other, the emission efficiency of the third emission layer 332 emitting the third color light that is blue light is less than the emission efficiency of the first emission layer 312 emitting the first color light that is red light and the emission efficiency of the second emission layer 322 emitting the second color light that is green light. In an embodiment, a length of each of the second pixels P21 and P22 in the first direction (+y direction) may be substantially the same as a length of each of the third pixels P31 and P32 in the first direction (+y direction). Accordingly, a width of each of the third pixels P31 and P32 in the second direction (+x direction) may be greater than a width of each of the second pixels P21 and P22 in the second direction (+x direction).

As described above, the first pixels P11 and P12 emitting the first color light are positioned in the rows R extending in the second direction (+x direction) crossing the first direction (+y direction) so that the first pixels P11 and P12 are between the neighboring second pixels P21 and P22 and/or between the neighboring third pixels P31 and P32. In an embodiment, the rows R may be between sets P2S of the pair of second pixels P21 and P22. The rows R may also be between sets P3S of the pair of third pixels P31 and P32.

In each of the rows R, the first emission layer 312 may be integrally formed as a single body in the set P1S of the pair of first pixels P11 and P12. Similarly, the second emission layer 322 may be integrally formed as a single body in the set P2S of the pair of second pixels P21 and P22, and the third emission layer 332 may be integrally formed as a single body in the set P3S of the pair of third pixels P31 and P32.

Each pixel should secure a sufficient emission area to implement a high-quality display apparatus capable of displaying high-luminance images. This is because as the emission area increases, light of higher luminance may be emitted. In the display apparatus according to an embodiment, the first emission layer 312 is integrally formed as a single body in the set P1S of the pair of first pixels P11 and P12, and accordingly, by reducing the separation distance d1 between the first pixels P11 and P12 included in the set P1S, the area of the first pixel electrodes 311 may be increased, such that the first pixels P11 and P12 may secure a sufficient emission area. In addition, when the first emission layer 312 is formed in a predetermined area by the deposition method or the like, as the predetermined area decreases, deposition efficiency is reduced. In the display apparatus according to an embodiment, the first emission layer 312 is integrally formed as a single body in the set P1S of the pair of first pixels P11 and P12, and thus, deposition efficiency during the formation of the first emission layer 312 may be significantly increased.

As described above, in the display apparatus according to an embodiment, the separation distance d1 between the first pixels P11 and P12 included in the set P1S may be reduced. Accordingly, the separation distance d1 between the first pixels P11 and P12 included in each of sets P1S of the pair of first pixels P11 and P12 may be less than a separation distance d1' between the sets P1S of the pair of first pixels P11 and P12.

Similarly, in the display apparatus according to an embodiment, the second emission layer 322 is integrally formed as a single body in the set P2S of the pair of second pixels P21 and P22, and accordingly, by reducing a separation distance between the second pixels P21 and P22 included in the set P2S, the area of the second pixel electrodes 321 may be increased, such that the second pixels P21 and P22 may secure a sufficient emission area. In addition, the second emission layer 322 is integrally formed as a single body in the set P2S of the pair of second pixels P21 and P22, and thus, deposition efficiency during the formation of the second emission layer 322 may be significantly increased.

This also applies to the third pixels P31 and P32. In the display apparatus according to an embodiment, the third emission layer 332 is integrally formed as a single body in the set P3S of the pair of third pixels P31 and P32, and accordingly, by reducing a separation distance between the third pixels P31 and P32 included in the set P3S, the area of the third pixel electrodes 331 may be increased, such that the third pixels P31 and P32 may secure a sufficient emission area. In addition, the third emission layer 332 is integrally formed as a single body in the set P3S of the pair of third pixels P31 and P32, and thus, deposition efficiency during the formation of the third emission layer 332 may be significantly increased.

Figure 8:
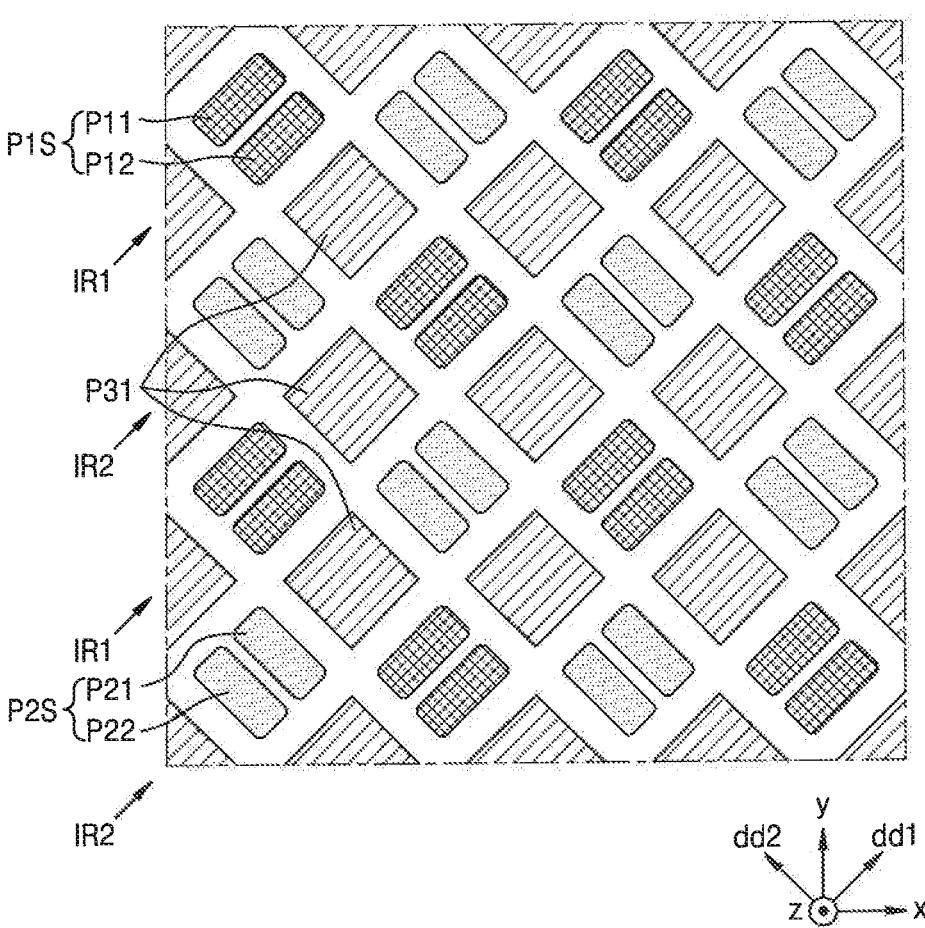
FIGS. 8 to 36 are schematic conceptual views of an arrangement of pixels of a display apparatus according to embodiments of the present inventive concept.

FIG. 8 is a schematic conceptual view of an arrangement of pixels of the display apparatus, according to an embodiment. In the display apparatus according to an embodiment, a plurality of third pixels P31 are arranged on grid points positioned at regular intervals in a first direction (+y direction) and a second direction (+x direction) perpendicular to the first direction (+y direction). First pixels P11 and P12 and second pixels P21 and P22 are between the third pixels P31 arranged as described above. For example, in an embodiment, the first pixels P11 and P12 or the second pixels P21 and P22 are between the third pixels P31 in first and second inclined columns IR1 and IR2 extending in a third direction (+dd1 direction) at an angle of about 45° to the first direction (+y direction). In addition, the first inclined column IR1 in which the first pixels P11 and P12 are positioned and the second inclined column IR2 in which the second pixels P21 and P22 may be alternately positioned (e.g., arranged).

In an embodiment, in each of the first inclined columns IR1 in which the first pixels P11 and P12 are positioned, two first pixels P11 and P12 may be between adjacent third pixels P31, and in each of the second inclined columns IR2 in which the second pixels P21 and P22 are positioned, two second pixels P21 and P22 may be between adjacent third pixels P31. The two first pixels P11 and P12 arranged as described above may be arranged in a fourth direction (+dd2 direction) substantially perpendicular to the third direction (+dd1 direction), and the two second pixels P21 and P22 may be arranged in the third direction (+dd1 direction). In an embodiment in which the two first pixels P11 and P12 are arranged in the fourth direction (+dd2 direction) substantially perpendicular to the third direction (+dd1 direction), it may mean that a boundary between the two first pixels P11 and P12 extends in the third direction (+dd1 direction). Similarly, when the two second pixels P21 and P22 are arranged in the third direction (+dd1 direction), it may mean that a boundary between the two second pixels P21 and P22 extend in the fourth direction (+dd2 direction) substantially perpendicular to the third direction (+dd1 direction).

A first emission layer 312 may be integrally formed as a single body in a set P1S of a pair of first pixels P11 and P12 between two adjacent third pixels P31. Similarly, a second emission layer 322 may be integrally formed as a single body in a set P2S of a pair of second pixels P21 and P22 between two adjacent third pixels P31.

Each pixel should secure a sufficient emission area to implement a high-quality display apparatus capable of displaying high-luminance images. This is because as the emission area increases, light of higher luminance may be emitted. In the display apparatus according to an embodiment, the first emission layer 312 is integrally formed as a single body in the set P1S of the pair of first pixels P11 and P12, and accordingly, by reducing a separation distance between the first pixels P11 and P12 included in the set P1S, the area of first pixel electrodes 311 may be increased, such that the first pixels P11 and P12 may secure a sufficient emission area. In addition, in an embodiment in which the first emission layer 312 is formed in a predetermined area by the deposition method or the like, as the predetermined area decreases, deposition efficiency is reduced. In the display apparatus according to an embodiment, the first emission layer 312 is integrally formed as a single body in the set P1S of the pair of first pixels P11 and P12, and thus, deposition efficiency during the formation of the first emission layer 312 may be significantly increased. This also applies to the set P2S of the pair of second pixels P21 and P22.

In an embodiment, the area of a third pixel P31 may be twice the area of each of the first pixels P11 and P12. Similarly, the area of the third pixel P31 may be twice the area of each of the second pixels P21 and P22. In a comparative embodiment in which the areas are equal to each other, the emission efficiency of the third emission layer 332 emitting third color light that is blue light is less than the emission efficiency of the first emission layer 312 emitting first color light that is red light and the emission efficiency of the second emission layer 322 emitting second color light that is green light.

Figure 9:
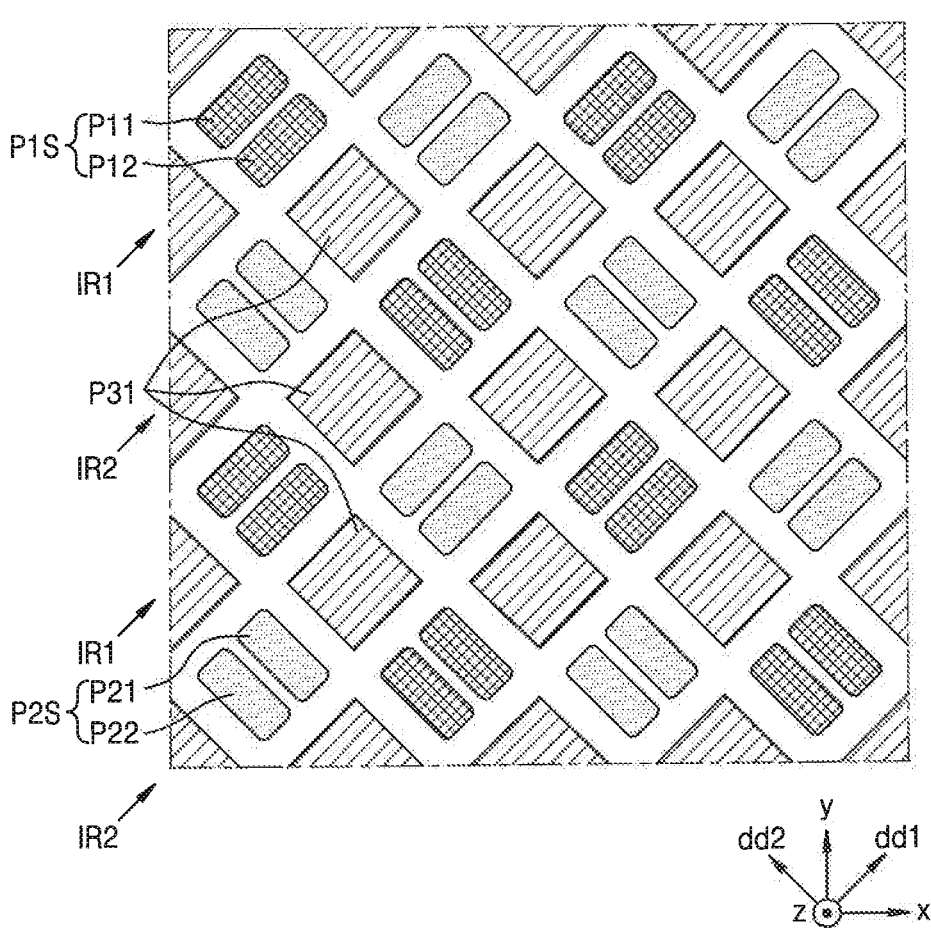

FIG. 9 is a schematic conceptual view of an arrangement of pixels of the display apparatus, according to an embodiment. The display apparatus according to an embodiment of FIG. 9 differs from the display apparatus described above with reference to FIG. 8 in the manner in which first pixels P11 and P12 are arranged and the manner in which second pixels P21 and P22 are arranged. In an embodiment, in the first inclined column IR1 in which the first pixels P11 and P12 are positioned, a direction in which two first pixels P11 and P12 are arranged may be alternately changed between a third direction (+dd1 direction) and a fourth direction (+dd2 direction). Similarly, in the second inclined column IR2 in which the second pixels P21 and P22 are positioned, a direction in which two second pixels P21 and P22 are arranged may be alternately changed between the third direction (+dd1 direction) and the fourth direction (+dd2 direction). For example, two first pixels P11 and P12 in the first inclined column IR1 may be arranged in the fourth direction (+dd2 direction) and the adjacent two first pixels P11 and P12 in the first inclined column IR1 may be arranged in the third direction (+dd1 direction). Similarly, two second pixels P21 and P22 in the second inclined column IR2 may be arranged in the third direction (+dd1 direction) and the adjacent two second pixels P21 and P22 in the second inclined column IR2 may be arranged in the fourth direction (+dd2 direction).

Figure 10:
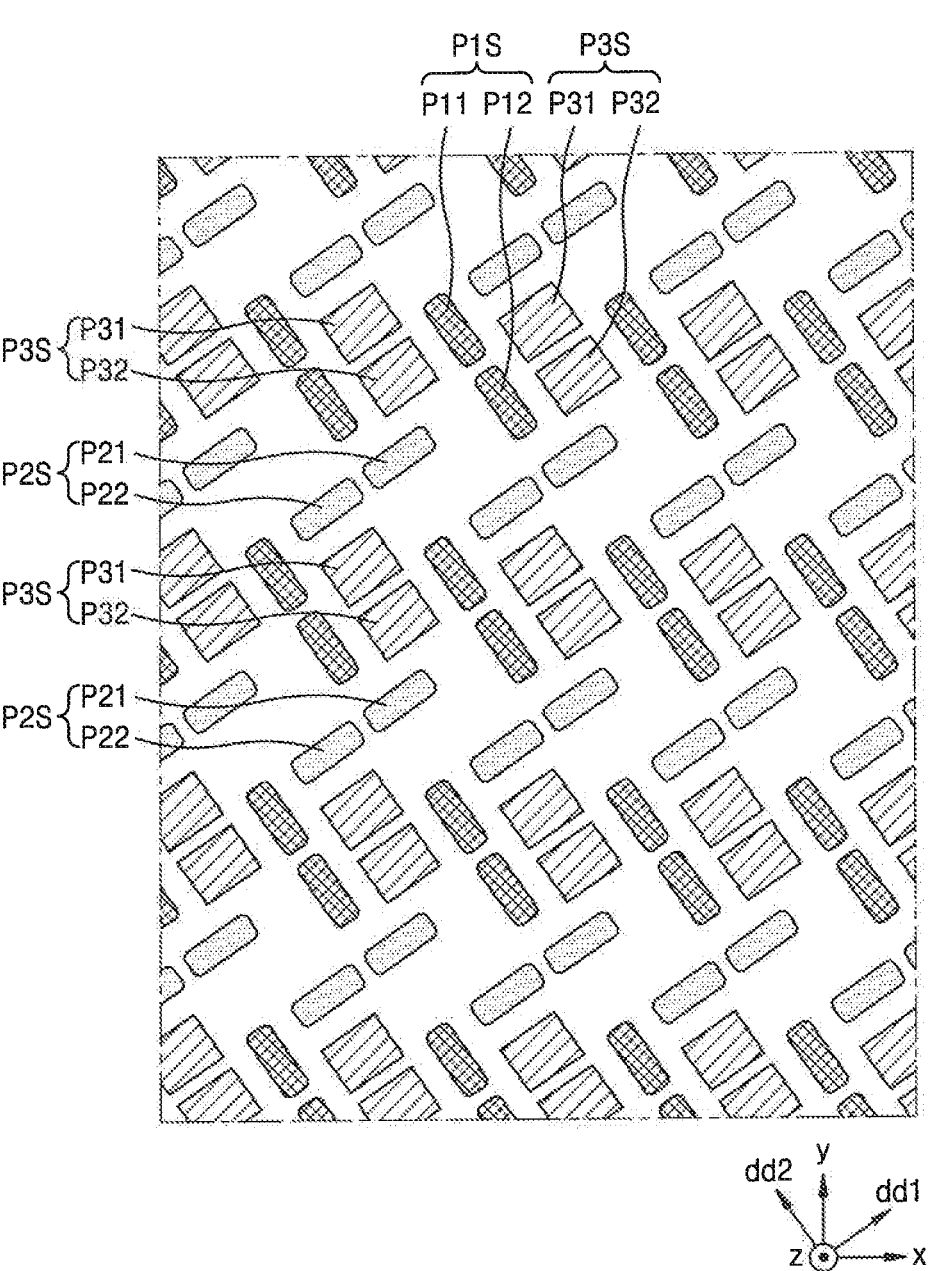

FIG. 10 is a schematic conceptual view of an arrangement of pixels of the display apparatus, according to an embodiment. In the display apparatus according to an embodiment, a set P2S of a pair of second pixels P21 and P22 and a set P3S of a pair of third pixels P31 and P32 are alternately positioned in a first direction (+y direction). In addition, a set P1S of a pair of first pixels P11 and P12 and the set P3S of the pair of third pixels P31 and P32 are alternately positioned in a second direction (+x direction) crossing the first direction (+y direction).

In the set P2S of the second pixels P21 and P22, the second pixels P21 and P22 may be arranged in a third direction (+dd1 direction) at an angle of about 45° to the first direction (+y direction). In an embodiment in which the second pixels P21 and P22 are arranged in the third direction (+dd1 direction), it may mean that a boundary between the second pixels P21 and P22 extend in a fourth direction (+dd2 direction) substantially perpendicular to the third direction (+dd1 direction). In the set P1S of the first pixels P11 and P12, the first pixels P11 and P12 may be arranged in the fourth direction (+dd2 direction). In an embodiment in which the first pixels P11 and P12 are arranged in the fourth direction (+dd2 direction), it may mean that a boundary between the first pixels P11 and P12 extend in the third direction (+dd1 direction) substantially perpendicular to the fourth direction (+dd2 direction). Similarly, in the set P3S of the third pixels P31 and P32, the third pixels P31 and P32 may be arranged in the fourth direction (+dd2 direction). In an embodiment in which the third pixels P31 and P32 are arranged in the fourth direction (+dd2 direction), it may mean that a boundary between the third pixels P31 and P32 extends in the third direction (+dd1 direction) substantially perpendicular to the fourth direction (+dd2 direction).

A first emission layer 312 may be integrally formed as a single body in the set P1S of the pair of first pixels P11 and P12. Similarly, a second emission layer 322 may be integrally formed as a single body in the set P2S of the pair of second pixels P21 and P22, and a third emission layer 332 may be integrally formed as a single body in the set P3S of the pair of third pixels P31 and P32. Accordingly, in each of the sets P1S, P2S, and P3S, the area of pixel electrodes may be increased, and thus, pixels may secure a sufficient emission area. In addition, deposition efficiency during the formation of emission layers may be significantly increased.

In an embodiment, the area of each of the third pixels P31 and P32 may be greater than the area of each of the first pixels P11 and P12. Similarly, the area of each of the third pixels P31 and P32 may be greater than the area of each of the second pixels P21 and P22. In a comparative embodiment in which the areas are equal to each other, the emission efficiency of the third emission layer 332 emitting third color light that is blue light is less than the emission efficiency of the first emission layer 312 emitting first color light that is red light and the emission efficiency of the second emission layer 322 emitting second color light that is green light.

Figure 11:
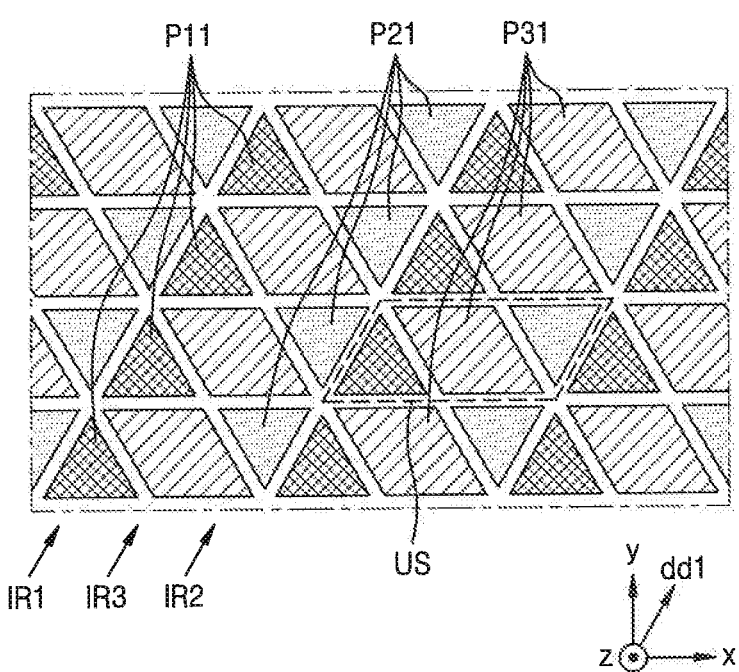

FIG. 11 is a schematic conceptual view of an arrangement of pixels of the display apparatus, according to an embodiment. In the display apparatus according to an embodiment, first pixels P11 emitting first color light are arranged in a first inclined column IR1 extending in a third direction (+dd1 direction) between a first direction (+y direction) and a second direction (+x direction). Second pixels P21 emitting second color light are also arranged in a second inclined column IR2 extending in the third direction (+dd1 direction)

between the first direction (+y direction) and the second direction (+x direction), and third pixels P31 capable of emitting third color light are also arranged in a third inclined column IR3 extending in the third direction (+dd1 direction) between the first direction (+y direction) and the second direction (+x direction).

The third inclined column IR3 may be between the first inclined column IR1 and the second inclined column IR2, and sets each including the first inclined column IR1, the second inclined column IR2, and the third inclined column IR3 may be repeatedly positioned along the second direction (+x direction).

Accordingly, as shown in FIG. 11, unit sets US each including a first pixel P11, a third pixel P31 and a second pixel P21 may be repeatedly positioned along the second direction (+x direction) and may also be repeatedly positioned along the third direction (+dd1 direction). In this embodiment, when viewed from a direction perpendicular to a substrate, the first pixel P11 and the second pixel P21 may have a triangular shape, and the second pixel P21 may have a shape in which the shape of the first pixel P11 is vertically inverted in the first direction (+y direction). In addition, accordingly, the third pixel P31 between the first pixel P11 and the second pixel P21 may have a parallelogram shape. In an embodiment, the area of the third pixel P31 may be greater than the area of the first pixel P11 and may be greater than the area of the second pixel P21. In a comparative embodiment in which the areas are equal to each other, the emission efficiency of the third emission layer 332 emitting the third color light that is blue light is less than the emission efficiency of a first emission layer 312 emitting the first color light that is red light and the emission efficiency of a second emission layer 322 emitting the second color light that is green light.

Figure 12:
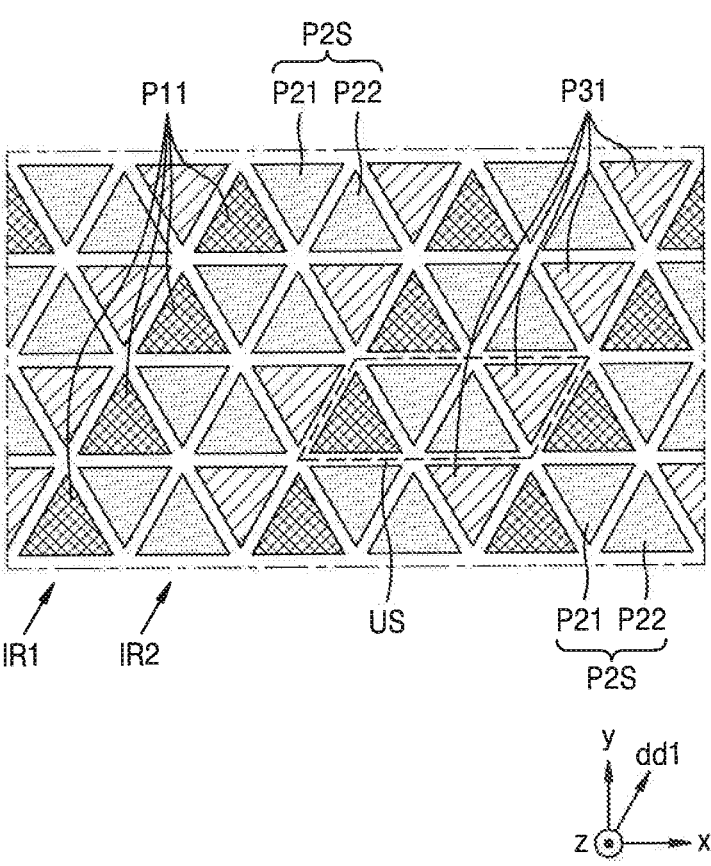

FIG. 12 is a schematic conceptual view of an arrangement of pixels of the display apparatus, according to an embodiment. In the display apparatus according to an embodiment, the first pixel P11 emitting first color light and the second pixel emitting second color light are alternately arranged in a first inclined column IR1 extending in a third direction (+dd1 direction) between a first direction (+y direction) and a second direction (+x direction). In addition, the second pixel P22 emitting second color light and the third pixel P31 emitting third color light are alternately arranged in a second inclined column IR2 extending in the third direction (+dd1 direction) between the first direction (+y direction) and the second direction (+x direction). Sets each including the first inclined column IR1 and the second inclined column IR2 may be repeatedly positioned along the second direction (+x direction).

In this embodiment, when viewed from a direction perpendicular to a substrate, a first pixel P11 and a second pixel P21 may have a triangular shape, and the second pixel P21 may have a shape in which the shape of the first pixel P11 is vertically inverted in the first direction (+y direction). In addition, when viewed from the direction perpendicular to the substrate, the combined shape of one first pixel P11 and one second pixel P21 adjacent to each other may have a parallelogram shape. Similarly, when viewed from the direction perpendicular to the substrate, each of a third pixel P31 and a second pixel P22 may have a triangular shape, and the second pixel P22 may have a shape in which the shape of the third pixel P31 is vertically inverted in the first direction (+y direction). In addition, when viewed from the direction perpendicular to the substrate, the combined shape of one third pixel P31 and one second pixel P22 adjacent to each other may have a parallelogram shape. Also, the third pixel P31 may have a shape in which the shape of the first pixel P11 is vertically inverted in the first direction (+y direction). In addition, the second pixel P22 may have a shape in which the shape of the second pixel P21 is vertically inverted in the first direction (+y direction). Accordingly, as shown in FIG. 12, unit sets US each including a first pixel P11, a second pixel P21, a second pixel P22, and a third pixel P31 may be repeatedly positioned along the second direction (+x direction) and may also be repeatedly positioned along the third direction (+dd1 direction).

Since one unit set US includes two second pixels P21 and P22, the area of the first pixel P11 may be greater than the area of each of the second pixels P21 and P22, and similarly, the area of the third pixel P31 may be greater than the area of each of the second pixels P21 and P22. In addition, since two second pixels P21 and P22 are arranged adjacent to each other in one unit set US, and a second emission layer 322 may be integrally formed as a single body in a set P2S of a pair of second pixels P21 and P22. Accordingly, by reducing a separation distance between the second pixels P21 and P22 included in the set P2S, the area of second pixel electrodes 321 may be increased, such that the second pixels P21 and P22 may secure a sufficient emission area. Additionally, the second emission layer 322 is integrally formed as a single body in the set P2S of the pair of second pixels P21 and P22, and thus, deposition efficiency during the formation of the second emission layer 322 may be significantly increased.

Figure 13:
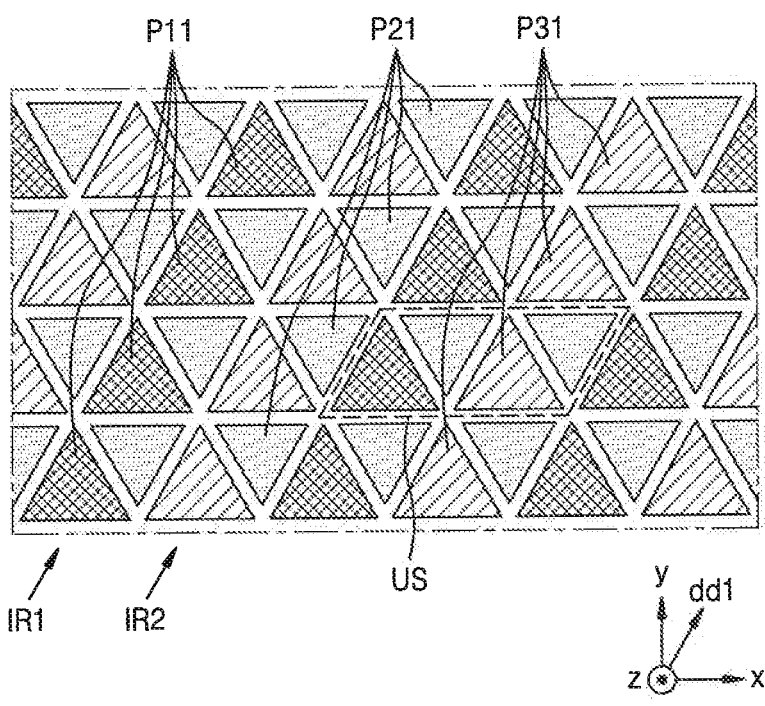

FIG. 13 is a schematic conceptual view of an arrangement of pixels of the display apparatus, according to an embodiment. The display apparatus according to an embodiment of FIG. 13 differs from the display apparatus according to an embodiment described above with reference to FIG. 12 in that, when viewed from a direction perpendicular to a substrate, a third pixel P31 has the same shape as a first pixel P11 as opposed to a shape in which the shape of the first pixel P11 is vertically inverted in a first direction (+y direction). Second pixels P21 have the same shape, which is the shape in which the shape of the first pixel P11 is vertically inverted in the first direction (+y direction). Accordingly, one unit set US may include a first pixel P11, a second pixel P21, a third pixel P31, and a second pixel P21, which are sequentially arranged in a second direction (+x direction).

Figure 14:
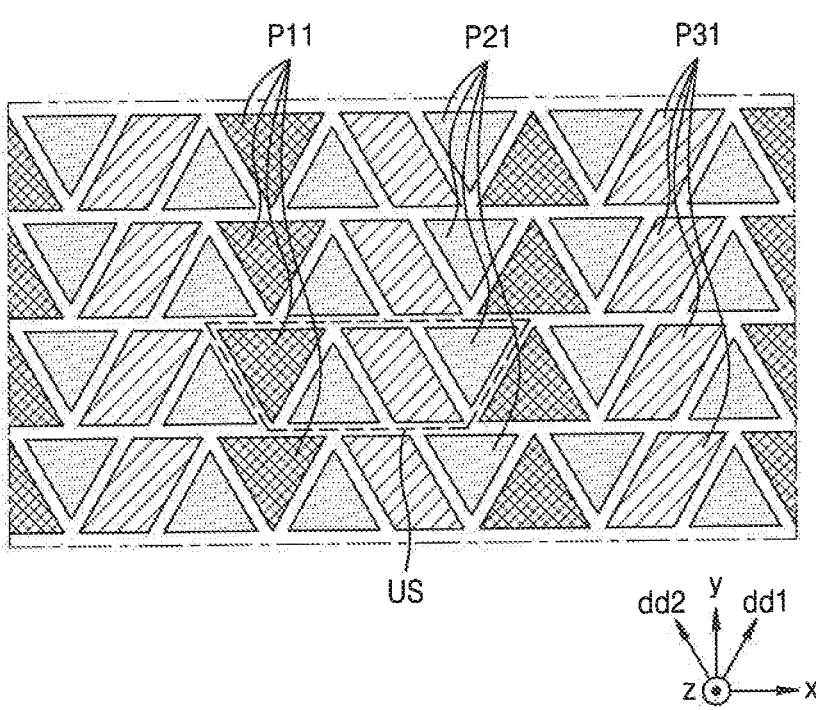

FIG. 14 is a schematic conceptual view of an arrangement of pixels of the display apparatus, according to an embodiment. In the display apparatus according to an embodiment of FIG. 14, a unit set US includes one first pixel P11, two second pixels P21, and one third pixel P31.

When viewed from a direction perpendicular to a substrate, each of the first pixel P11 and the second pixels P21 has a triangular shape, and the third pixel P31 has a parallelogram shape. One of the second pixels P21 may have a shape in which the other thereof is vertically inverted in the first direction (+y direction). Since the third pixel P31 is between the second pixels P21, the overall shape of the second pixel P21, the third pixel P31, and the second pixel P21, which are consecutively arranged in the second direction (+x direction), may have a substantially parallelogram shape, and accordingly, the unit set US including the first pixel P11, the second pixel P21, the third pixel P31, and the second pixel P21, which are consecutively arranged in the second direction (+x direction), may have a trapezoidal shape. Such unit sets US may be repeatedly positioned along the first direction (+y direction) and the second direction (+x direction). Since one unit set US includes two second pixels P21, the area of the first pixel P11 may be greater than the area of the second pixel P21, and similarly, the area of the third pixel P31 may be greater than the area of the second pixel P21.

Figure 15:
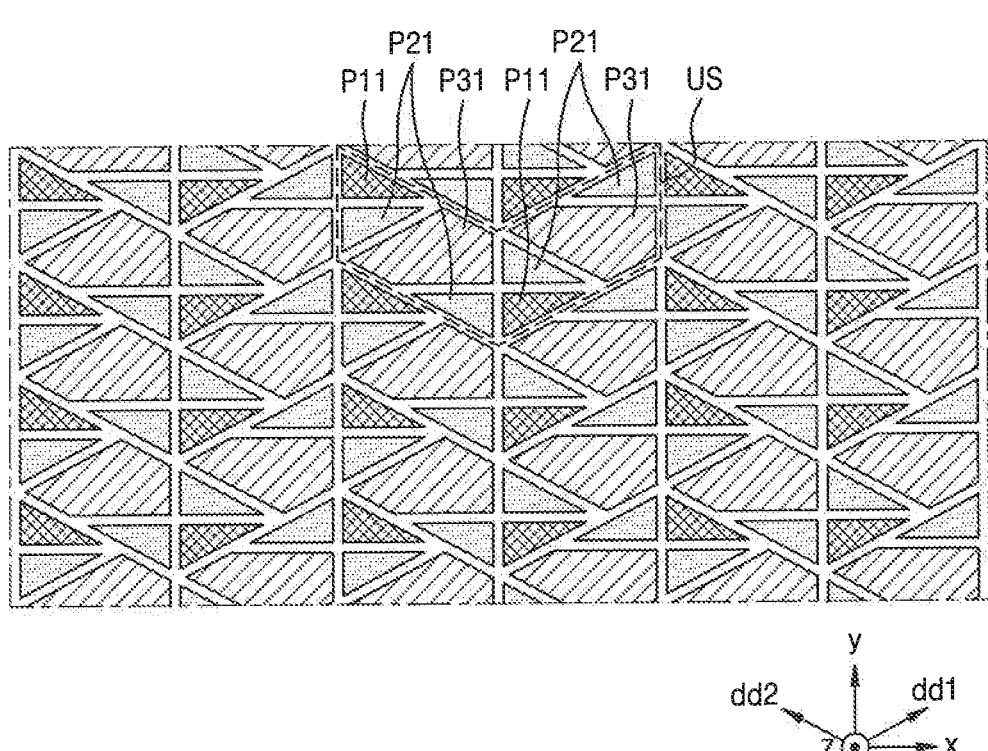

FIG. 15 is a schematic conceptual view of an arrangement of pixels of the display apparatus, according to an embodiment. When viewed from a direction perpendicular to a substrate, a unit set US included in the display apparatus according to an embodiment of FIG. 15 has a V shape, is repeatedly positioned along a first direction (+y direction), and is also repeatedly positioned along a second direction (+x direction). Since one unit set US has a V shape, it may be understood that the unit set US includes two prongs. A first prong may extend in a third direction (+dd1 direction) between the first direction (+y direction) and the second direction (+x direction), and a second prong may extend in a fourth direction (+dd2 direction) symmetrical to the third direction (+dd1 direction) with respect to the first direction (+y direction).

In an embodiment, the first prong may include one first pixel P11, two second pixels P21, and one third pixel P31. Each of the first pixel P11 and the second pixels P21 may have a right triangular shape, and the first pixel P11, the second pixel P21, the third pixel P31, and the second pixel P21 may be sequentially arranged in the third direction (+dd1 direction). In the first prong, the first pixel P11 and the second pixel P21 arranged adjacent to each other may be arranged so that a boundary therebetween extends in the second direction (+x direction). For example, in the first prong, the first pixel P11 and the second pixel P21 arranged adjacent to each other may be substantially symmetrical to each other with respect to an axis extending in the second direction (+x direction).

The second prong may also include one first pixel P11, two second pixels P21, and one third pixel P31. Each of the first pixel P11 and the two second pixels P21 may have a right triangular shape, and the second pixel P21, the third pixel P31, the second pixel P21, and the first pixel P11 may be sequentially arranged in the fourth direction (+dd2 direction). In the second prong, the first pixel P11 and the second pixel P21 arranged adjacent to each other may be arranged so that a boundary therebetween extends in the second direction (+x direction). For example, in the second prong, the first pixel P11 and the second pixel P21 arranged adjacent to each other may be substantially symmetrical to each other with respect to an axis extending in the second direction (+x direction).

Figure 16:
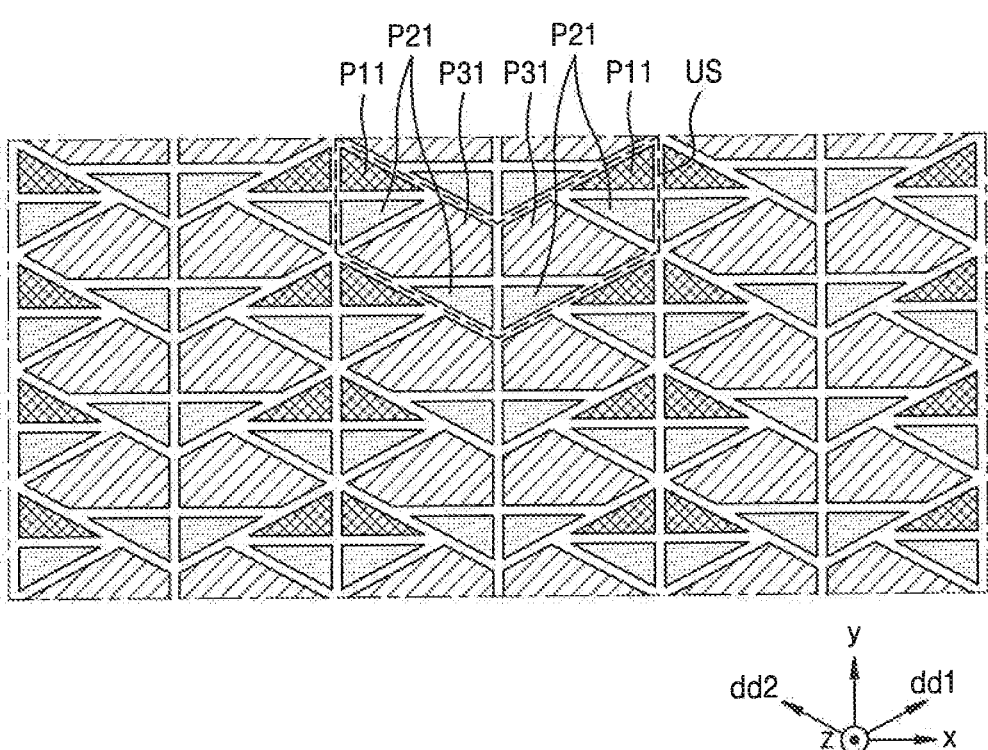

FIG. 16 is a schematic conceptual view of an arrangement of pixels of the display apparatus, according to an embodiment. The display apparatus according to an embodiment of FIG. 16 differs from the display apparatus according to an embodiment described above with reference to FIG. 15 in that an arrangement of pixels in a first prong is symmetrical to an arrangement of pixels in a second prong with respect to an axis extending in a first direction (+y direction). The arrangement of pixels in the second prong may be the same as the arrangement of pixels in the second prong in the display apparatus according to an embodiment described above with reference to FIG. 15.

In the display apparatus according to an embodiment of FIG. 16, a first emission layer 312 may be integrally formed as a single body in first pixels P11 positioned adjacent to each other in a second direction (+x direction). The first pixels P11 positioned adjacent to each other in a second direction (+x direction) may be positioned in adjacent unit sets US from each other. In addition, a second emission layer 322 may be integrally formed as a single body in second pixels P21 positioned adjacent to each other in the second direction (+x direction), and a third emission layer 332 may be integrally formed as a single body even in third pixels P31 positioned adjacent to each other in the second direction (+x direction). Accordingly, the first emission layer 312 is integrally formed as a single body in the first pixels P11 positioned adjacent to each other in the second direction (+x direction), and accordingly, by reducing a separation distance between the first pixels P11 positioned adjacent to each other, the area of first pixel electrodes 311 may be increased, such that a first pixel P11 may secure a sufficient emission area. Additionally, since the first emission layer 312 is integrally formed as a single body in the first pixels P11 positioned adjacent to each other in the second direction (+x direction), deposition efficiency during the formation of the first emission layer 312 may be significantly increased. This also applies to the second pixels P21 and the third pixels P31.

Figure 17:
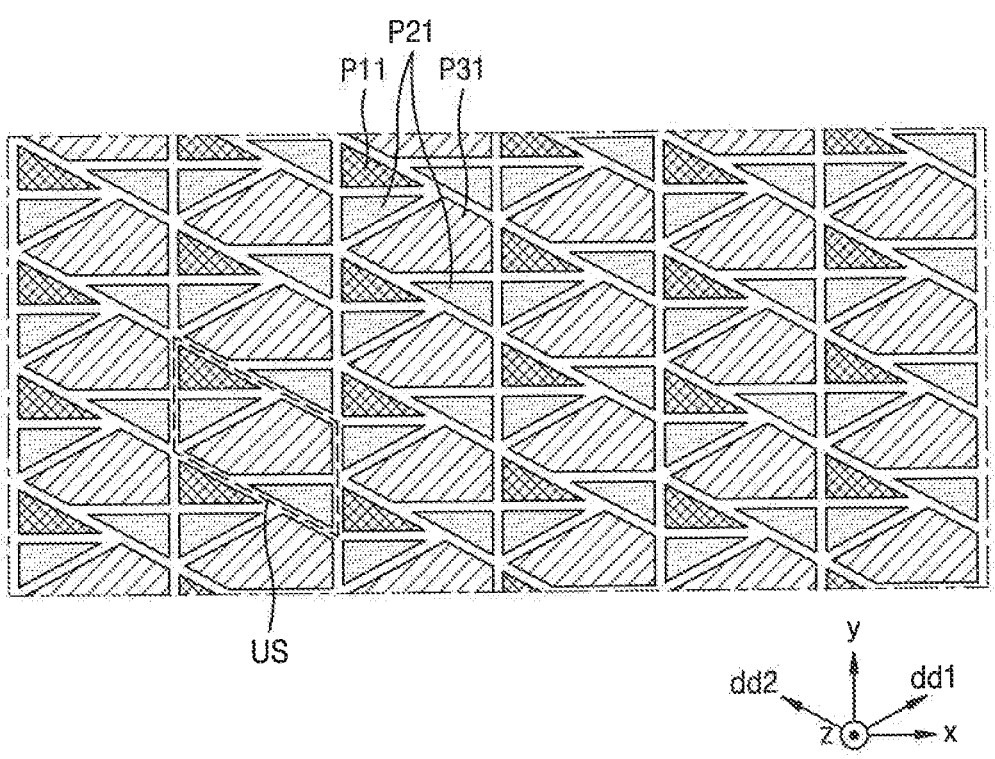

FIG. 17 is a schematic conceptual view of an arrangement of pixels of the display apparatus, according to an embodiment. The display apparatus according to an embodiment of FIG. 17 includes, as a unit set US, the second prong of the unit set of the display apparatus described above with reference to FIG. 15. For example, the unit set US of the display apparatus according to an embodiment of FIG. 17 may include one first pixel P11, two second pixels P21, and one third pixel P31. Each of the first pixel P11 and the second pixels P21 may have a right triangular shape, and the second pixel P21, the third pixel P31, the second pixel P21, and the first pixel P11 may be sequentially arranged in a fourth direction (+dd2 direction). In the unit set US, the first pixel P11 and the second pixel P21 arranged adjacent to each other may be arranged so that a boundary therebetween extends in a second direction (+x direction). For example, in the unit set US, the first pixel P11 and the second pixel P21 arranged adjacent to each other may be substantially symmetrical to each other with respect to an axis extending in the second direction (+x direction).

Figure 18:
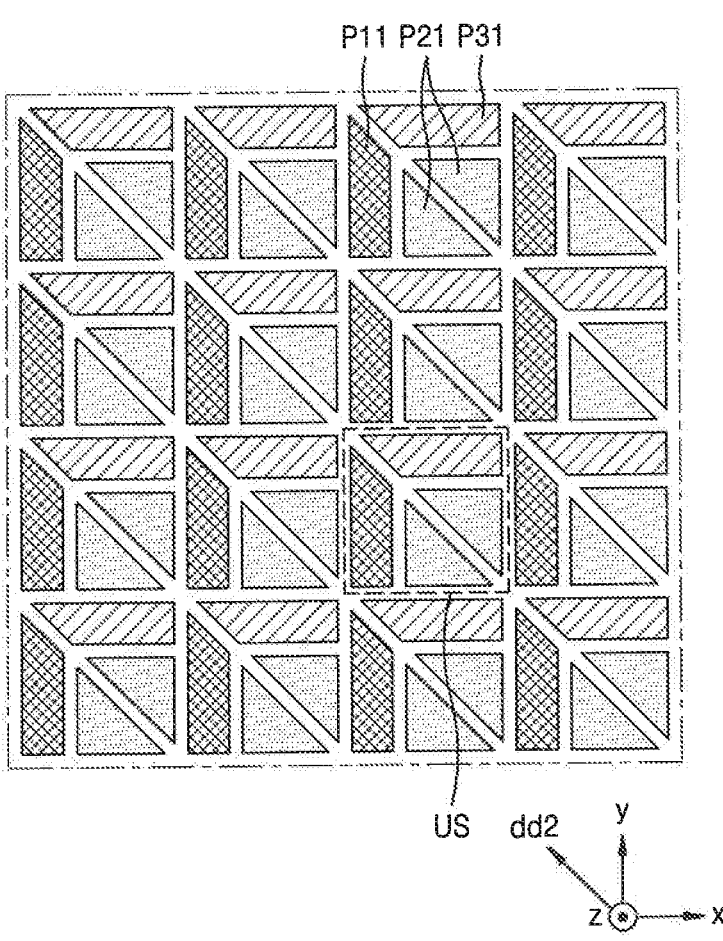

FIG. 18 is a schematic conceptual view of an arrangement of pixels of the display apparatus, according to an embodiment. When viewed from a direction perpendicular to a substrate, a unit set US included in the display apparatus according to an embodiment of FIG. 18 may have a substantially rectangular shape. In an embodiment, the unit set US may include one first pixel P11, two second pixels P21, and one third pixel P31. The unit sets US may be repeatedly arranged in a first direction (+y direction) and a second direction (+x direction).

In one unit set US, each of two second pixels P21 may have a right-angled triangular shape, and the two second pixels P21 may be symmetrical to each other with respect to an axis extending in a fourth direction (+dd2 direction) between the first direction (+y direction) and an opposite direction (−x direction) to the second direction. Hypotenuses of right triangles of the two second pixels P21 may be adjacent to each other. The first pixel P11 has a trapezoidal shape so that a combined shape of one second pixel P21 and the first pixel P11 that is positioned in the opposite direction (−x direction) to the second direction from the one second pixel P21 is a right triangular shape. The third pixel P31 has a trapezoidal shape so that a combined shape of the other second pixel P21 and the third pixel P31 that is positioned in the first direction (+y direction) from the other second pixel P21 has a right triangular shape.

Figure 19:
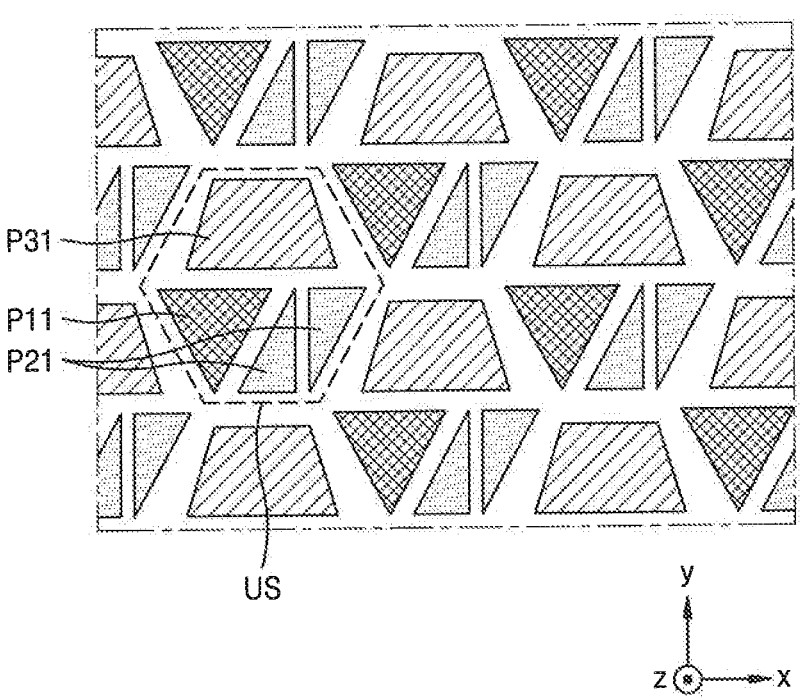

FIG. 19 is a schematic conceptual view of an arrangement of pixels of the display apparatus, according to an embodiment. When viewed from a direction perpendicular to a substrate, a unit set US included in the display apparatus according to an embodiment of FIG. 19 may have a substantially hexagonal shape.

A third pixel P31 may be positioned on one side of the unit set US in a first direction (+y direction) with respect to a central axis extending in a second direction (+x direction). Accordingly, when viewed from a direction perpendicular to a substrate, the third pixel P31 may have a substantially equilateral trapezoidal shape. In this embodiment, a longer side extending in the second direction +x among two parallel sides may be positioned at the center of the unit set US.

One first pixel P11 and two second pixels P21 may be positioned on the other side of the unit set US (e.g., in the first direction +y). When viewed from the direction perpendicular to the substrate, the first pixels P11 may have a substantially equilateral triangle shape. Each of the two second pixels P21 has a right triangular shape, and a boundary therebetween extends in the first direction (+y direction), such that the two second pixels P21 may have a parallelogram shape overall. One of the second pixels P21 adjacent to the first pixel P11 may have a hypotenuse positioned adjacent to the first pixel P11. In an embodiment, sizes of both end angles of the longer side among the two sides of the third pixel P31 having an equilateral trapezoidal shape may be greater than a size of each of interior angles of the first pixel P11.

Figure 20:
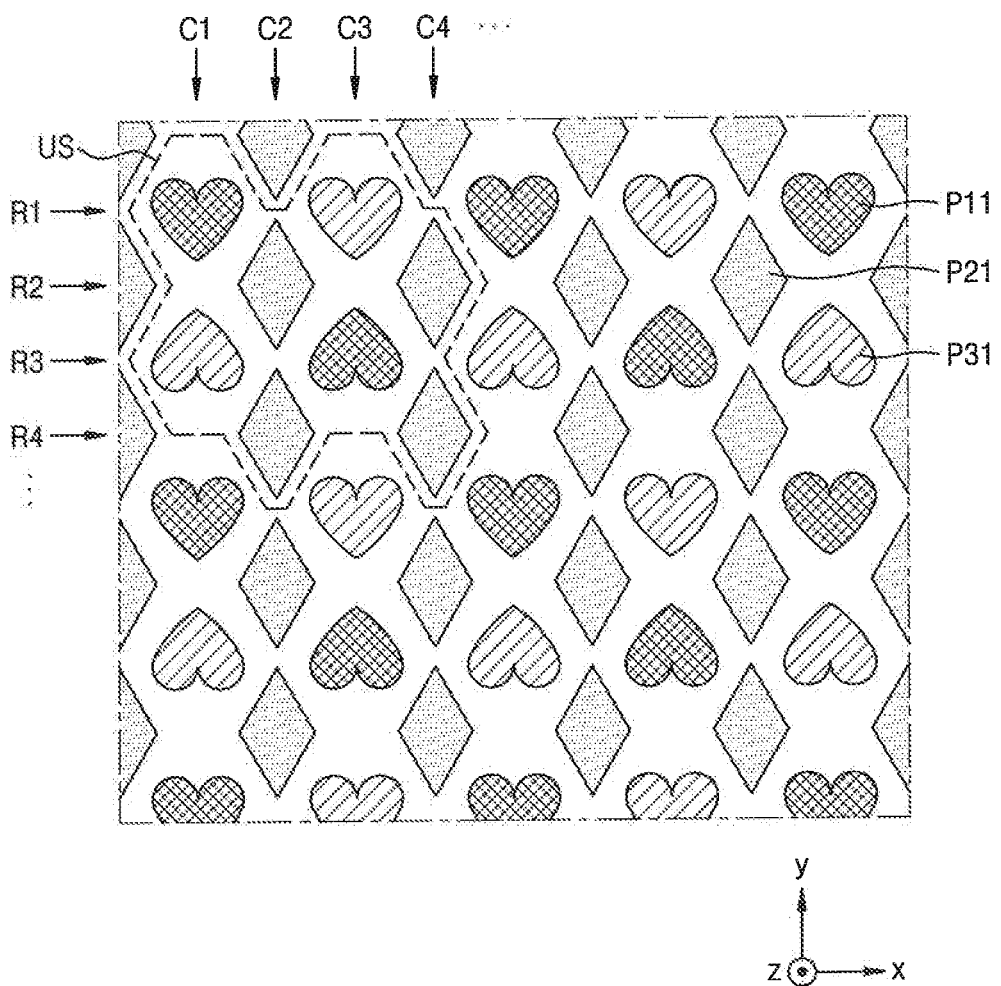

FIG. 20 is a schematic conceptual view of an arrangement of pixels of the display apparatus, according to an embodiment. In the display apparatus according to an embodiment of FIG. 20, the first pixel P11 and the third pixel P31 may be alternately positioned, respectively in a first column C1 and a third column C3, which extend in a first direction (+y direction), and second pixels P21 may be positioned in each of a second column C2 and a fourth column C4, which extend in the first direction (+y direction). Sets each including portions of the first column C1, the second column C2, the third column C3, and the fourth column C4 may be repeatedly positioned along a second direction (+x direction) and the first direction (+y direction).

Considering the first column C1 and the third column C3, different pixels are arranged in a second direction (+x direction). Accordingly, the first pixel P11 and the third pixel P31 are alternately positioned in each of a first row R1 and a third row R3, which extend in the second direction (+x direction). Second pixels P21 may be positioned in each of a second row R2 and a fourth row R4, which extend in the second direction (+x direction). Sets each including the first row R1, the second row R2, the third row R3, and the fourth row R4 may be repeatedly positioned along an opposite direction (−x direction) to the second direction. Accordingly, a plurality of second pixels P21 are arranged on grid points positioned at regular intervals in the first direction (+y direction) and the second direction (+x direction) perpendicular to the first direction (+y direction).

When viewed from a direction perpendicular to a substrate, each of the first pixels P11 and the third pixels P31 may have a heart shape or a heart shape inverted in the first direction (+y direction). The shape of the first pixels P11 and the third pixels P31 may alternate in adjacent rows. For example, in an embodiment, in the first row R1, the first pixels P11 and the third pixels P31 may have a heart shape and in the third row R3, the first pixels P11 and the third pixels P31 may have a heart shape inverted in the first direction (+y direction). Each of the second pixels P21 may have a diamond shape (e.g., a rhombus shape). In addition, unit sets US each including two first pixels P11, two third pixels P31, and four second pixels P21 may be repeatedly positioned along the first direction (+y direction) and the second direction (+x direction).

Figure 21:
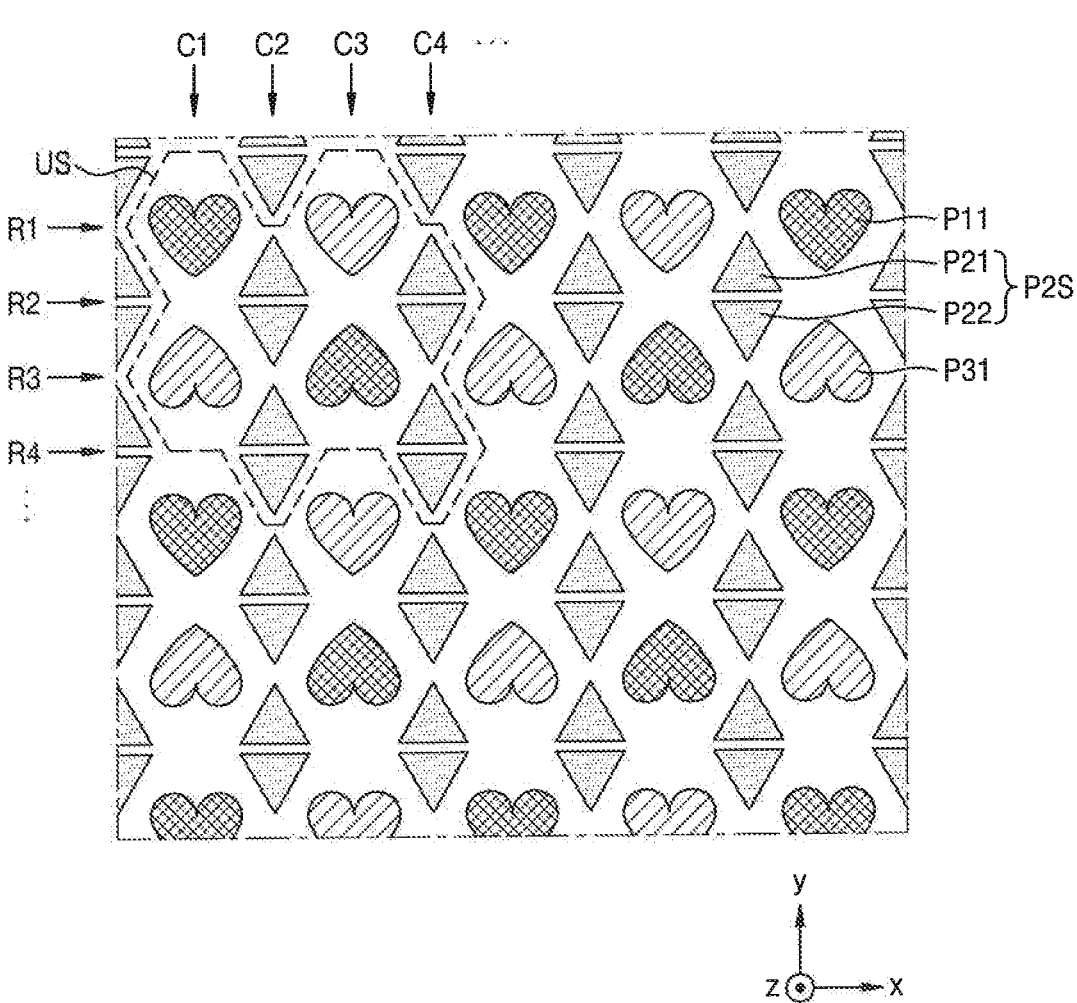

FIG. 21 is a schematic conceptual view of an arrangement of pixels of the display apparatus, according to an embodiment. The display apparatus according to an embodiment of FIG. 21 differs from the display apparatus described above with reference to FIG. 20 in that one second pixel in FIG. 20 is replaced with two second pixels P21 and P22. Each of the two second pixels P21 and P22 may have a triangular shape, and a boundary between the two second pixels P21 and P22 may extend in a second direction (+x direction). The combined shape of the two second pixels P21 and P22 may be a diamond shape. A second emission layer 322 may be integrally formed as a single body in a set P2S of such a pair of second pixels P21 and P22. Accordingly, by reducing a separation distance between the second pixels P21 and P22 positioned adjacent to each other, the area of second pixel electrodes 321 may be increased, such that the second pixels P21 and P22 may secure a sufficient emission area. Additionally, the second emission layer 322 is integrally formed as a single body in the set P2S of the pair of second pixels P21 and P22, and thus, deposition efficiency during the formation of the second emission layer 322 may be significantly increased.

Figure 22:
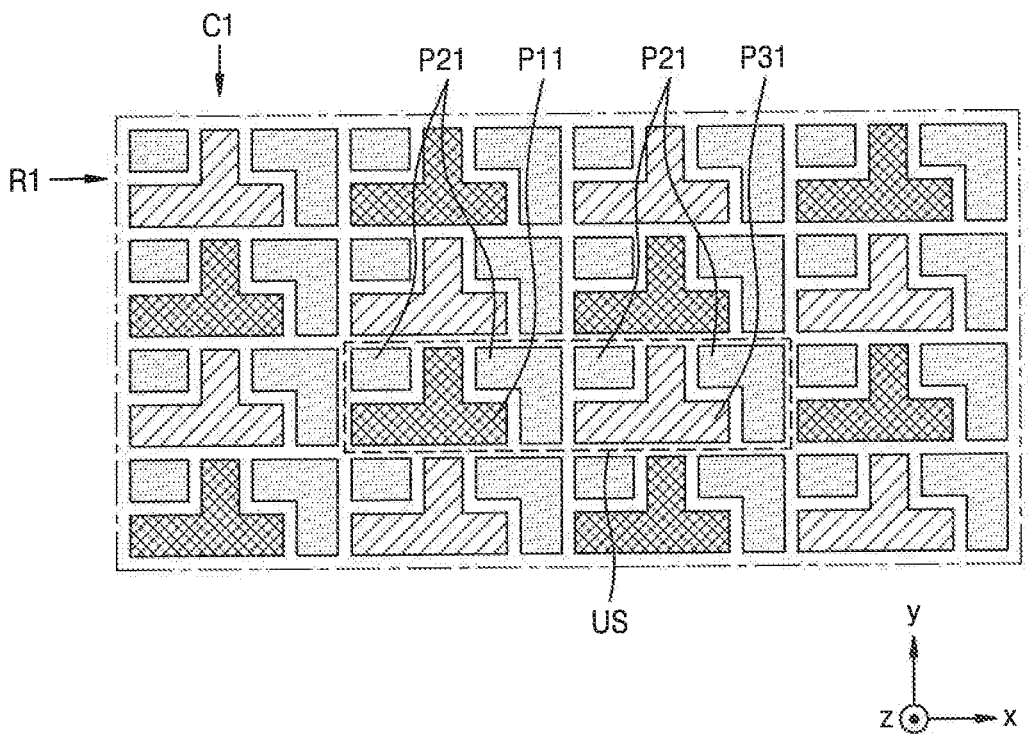

FIG. 22 is a schematic conceptual view of an arrangement of pixels of the display apparatus, according to an embodiment. As shown in FIG. 22, when viewed from a direction perpendicular to a substrate, each of unit sets US repeatedly positioned along a first direction (+y direction) and a second direction (+x direction) may have a rectangular shape. One unit set US may include two rectangular shape portions. In one of the rectangular shape portions, a first pixel P11 emitting first color light may have a vertically inverted "T" shape, and one of two second pixels P21 may have a "¬" shape and may be positioned to correspond to the shape of the first pixel P11, and the other thereof may have a dot shape filling an empty space. For example, the dot shaped second pixel P21 may have a rectangular shape. In the other of the rectangular shape portions, a third pixel P31 capable of emitting third color light may have a vertically inverted "T" shape, and one of two second pixels P21 may have a "¬" shape and may be positioned to correspond to the shape of the third pixel P31, and the other thereof may have a dot shape filling an empty space. For example, the dot shaped second pixel P21 may have a rectangular shape. Accordingly, in a first column C1 extending in the first direction (+y direction), the first pixel P11 and the third pixel P31 each having a vertically inverted "T" shape may be alternately positioned, and also in a first row R1 extending in the second direction (+x direction), the first pixel P11 and the third pixel P31 each having a vertically inverted "T" shape may be alternately positioned. The second pixels P21 may fill an empty space between the first pixels P11 and the third pixels P31.

Figure 23:
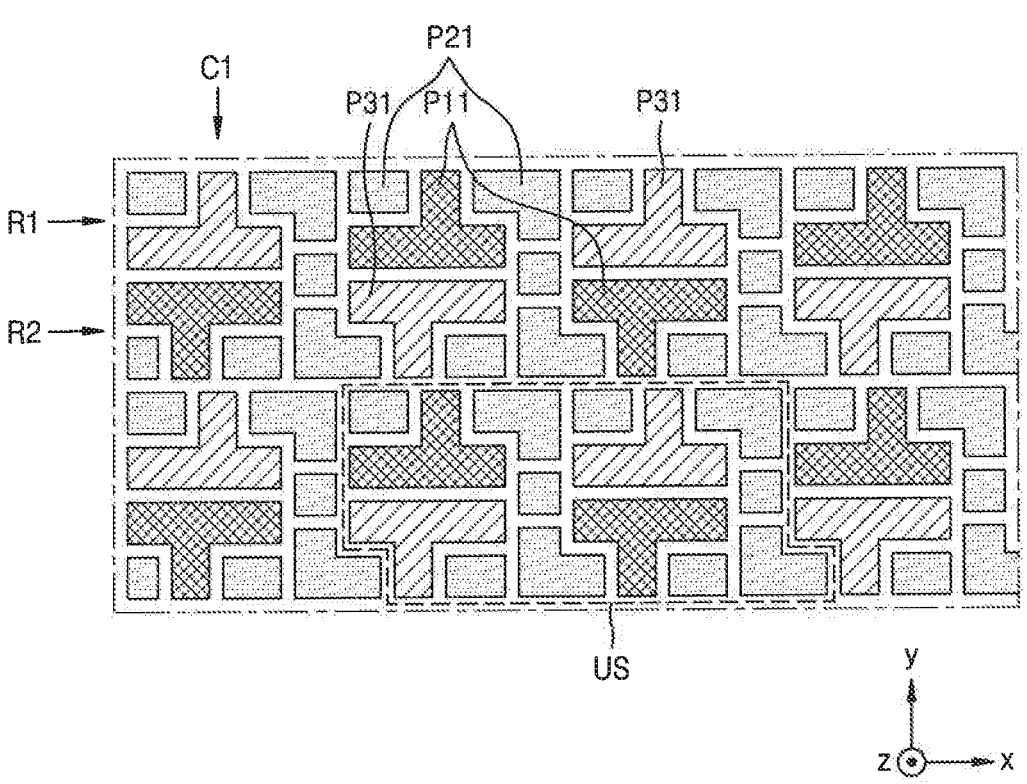

However, one or more embodiments of the present inventive concept are not necessarily limited thereto, and various modifications may be made. For example, as shown in FIG. 23, which is a schematic conceptual view of an arrangement of pixels of the display apparatus, according to an embodiment, the first row R1 may have the same shape as that described above with reference to FIG. 22. However, in a second row R2, the first pixel P11 and the third pixel P31 are alternately positioned and may each have a "T" shape instead of a vertically inverted "T" shape. The first row R1 and the second row R2 may be alternately positioned in a first direction (+y direction). The second pixels P21 may fill an empty space between the first pixels P11 and the third pixels P31.

Figure 24:
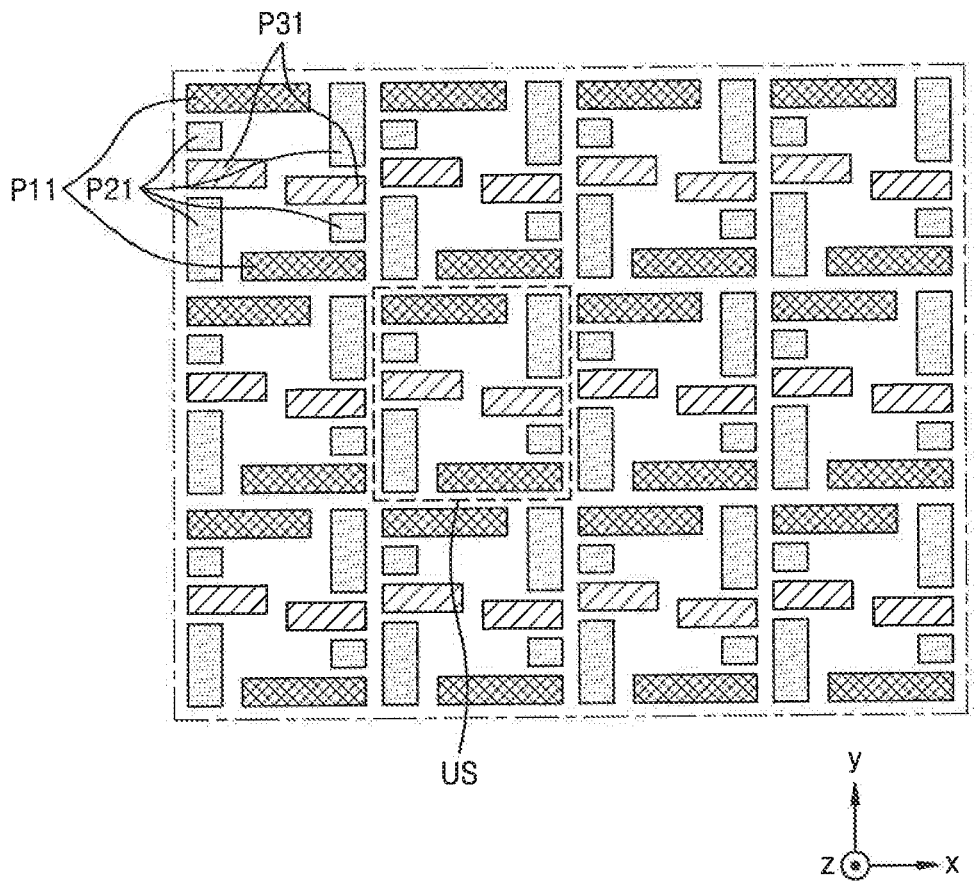

FIG. 24 is a schematic conceptual view of an arrangement of pixels of the display apparatus, according to an embodiment. When viewed from a direction perpendicular to a substrate, the display apparatus according to an embodiment of FIG. 24 includes a unit set US having a substantially rectangular shape, and the unit set US may include an "F"-shaped portion, and a vertically inverted "F"-shaped portion that are symmetrical to each other with respect to a first direction (+y direction). The "F"-shaped portion may include a first pixel P11 forming a longer side and a third pixel P31 forming a shorter side, the longer side and the short sider extending in a second direction (+x direction), and may also include second pixels P21 forming remaining sides of the "F"-shaped portion. The inverted "F"-shaped portion may have a configuration that is vertically inverted with respect to the first direction (+y direction) from the configuration of the "F"-shaped portion. Such unit sets US may be repeatedly positioned along the first direction (+y direction) and the second direction (+x direction).

Figure 25:
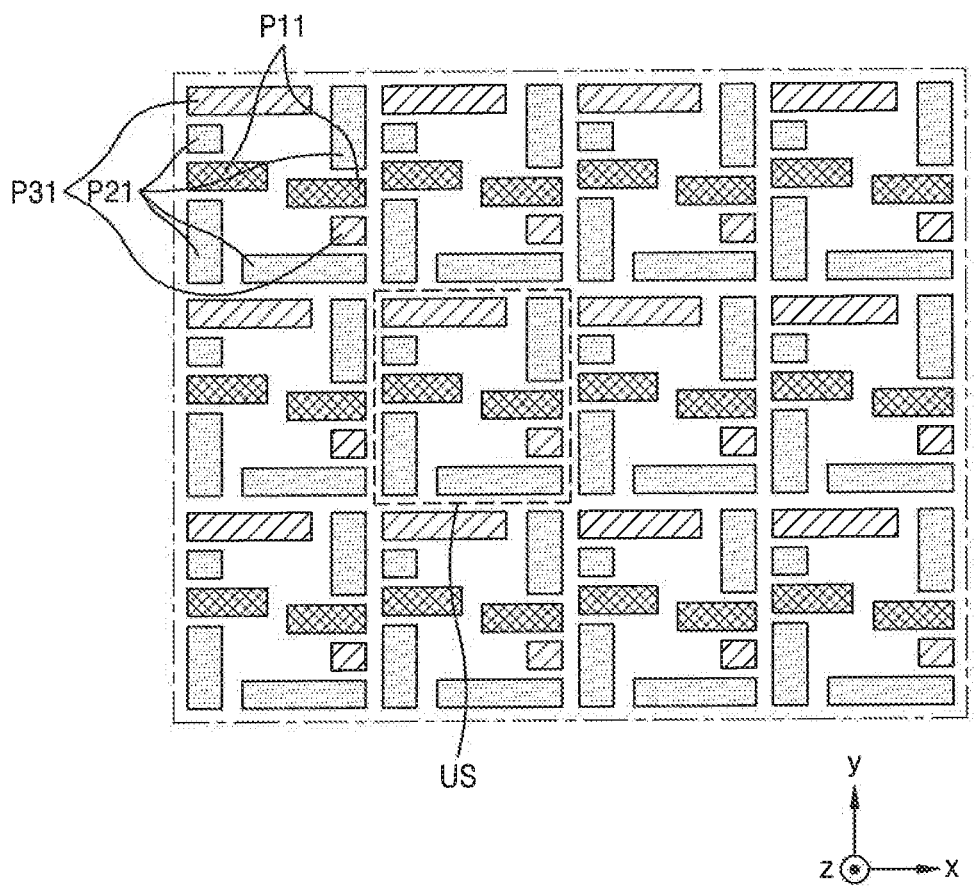

FIG. 25 is a schematic conceptual view of an arrangement of pixels of the display apparatus, according to an embodiment. When viewed from a direction perpendicular to a substrate, the display apparatus according to an embodiment of FIG. 25 also includes a unit set US having a substantially rectangular shape, and the unit set US may include an "F"-shaped portion, and a vertically inverted "F"-shaped portion that are symmetrical to each other with respect to a first direction (+y direction). In an embodiment, the "F"-shaped portion may include a third pixel P31 forming a longer side and a first pixel P11 forming a shorter side, the longer side and shorter side extending in a second direction (+x direction), and may also include second pixels P21 forming remaining sides of the "F"-shaped portion. The inverted "F"-shaped portion may include a second pixel P21 forming a longer side and a first pixel P11 forming a shorter side, the longer side and the shorter side extending in the second direction (+x direction), and a second pixel P21 and a third pixel P31 may form remaining sides of the inverted "F"-shaped portion. Such unit sets US may be repeatedly positioned along the first direction (+y direction) and the second direction (+x direction).

Figure 26:
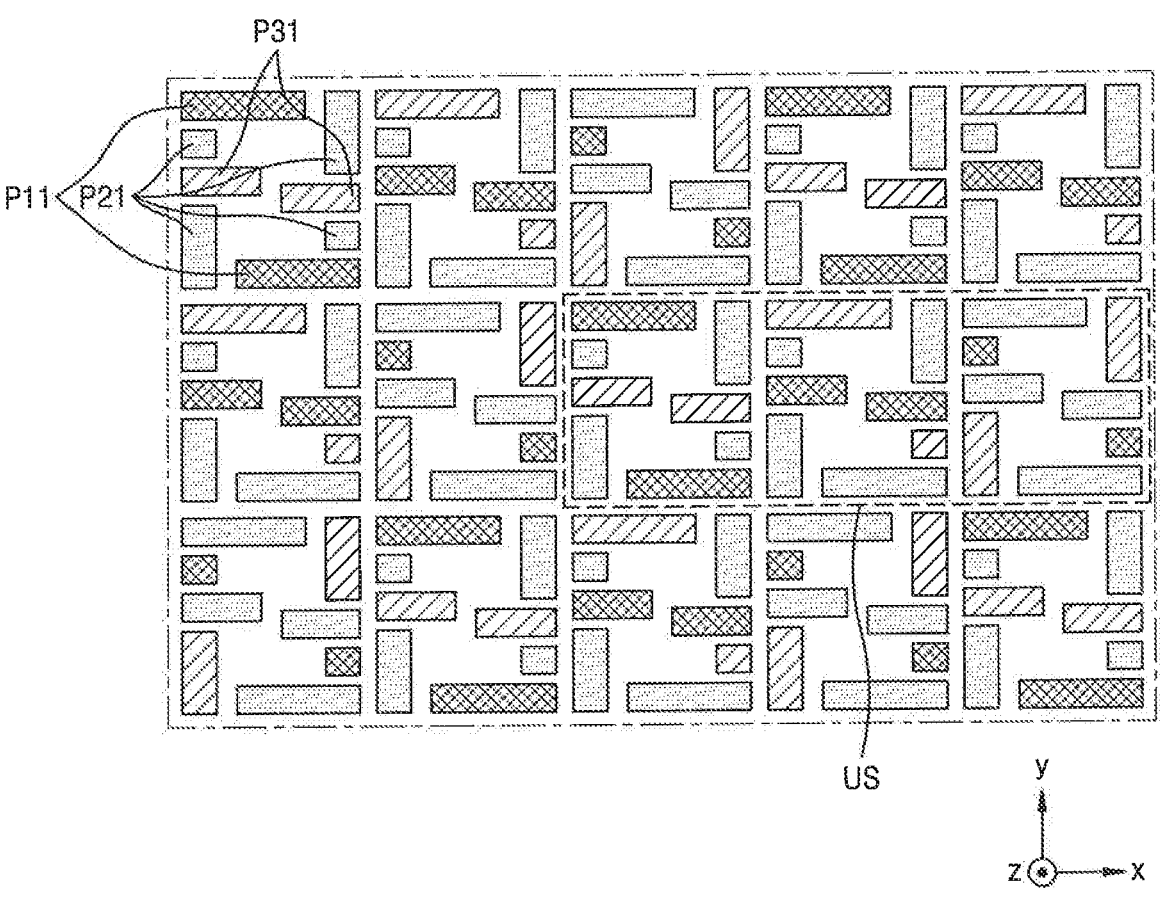

FIG. 26 is a schematic conceptual view of an arrangement of pixels of the display apparatus, according to an embodiment. A unit set US included in the display apparatus according to an embodiment of FIG. 26 includes three sets arranged in a second direction (+x direction), and each set includes an "F"-shaped portion, and a vertically inverted "F"-shaped portion with respect to a first direction (+y direction).

A first set among the three sets may have the same configuration as the unit set US included in the display apparatus according to an embodiment described above with reference to FIG. 24. A second set among the three sets may have the same configuration as the unit set US included in the display apparatus according to an embodiment described above with reference to FIG. 25. In a third set among the three sets, an inverted "F"-shaped portion may have a configuration that is vertically inverted with respect to the first direction (+y direction) from a configuration of the "F"-shaped portion. The "F"-shaped portion in the third set may include second pixels P21 forming a longer side and a shorter side, which extend in the second direction (+x direction), a first pixel P11 forming a side between the longer side and the shorter side, and a third pixel P31 forming a remaining side of the "F"-shaped portion.

Figure 27:
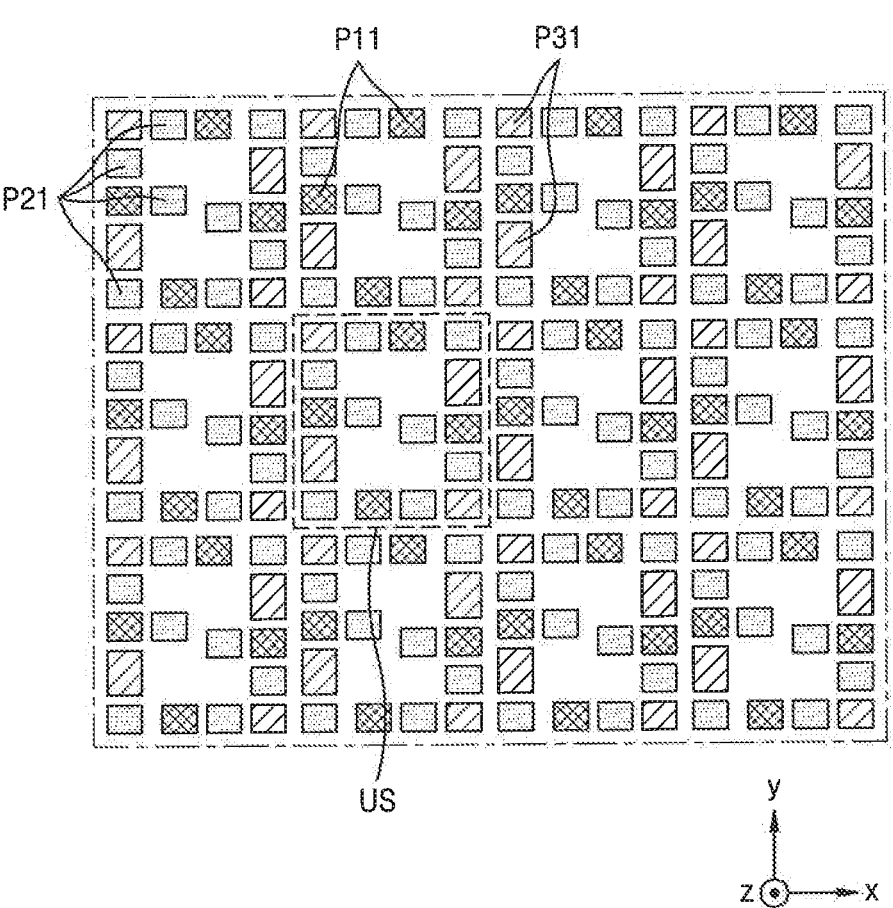

FIG. 27 is a schematic conceptual view of an arrangement of pixels of the display apparatus, according to an embodiment. When viewed from a direction perpendicular to a substrate, the display apparatus according to an embodiment of FIG. 27 includes a unit set US having a substantially rectangular shape, and the unit set US may include an "F"-shaped portion, and a vertically inverted "F"-shaped portion with respect to a first direction (+y direction). The inverted "F"-shaped portion may have a configuration that is vertically inverted with respect to the first direction (+y direction) from the configuration of the "F"-shaped portion. The "F"-shaped portion may include a third pixel P31, a second pixel P21, and a first pixel P11, which are arranged in a second direction (+x direction) to form a longer side extending in the second direction (+x direction), a first pixel P11 and a second pixel P21, which are arranged in the second direction (+x direction) to form a shorter side extending in the second direction (+x direction), a second pixel P21 arranged to form a side between the longer side and the shorter side, and a third pixel P31 and a second pixel P21 arranged to form remaining sides. Such unit sets US may be repeatedly positioned along the first direction (+y direction) and the second direction (+x direction).

Figure 28:
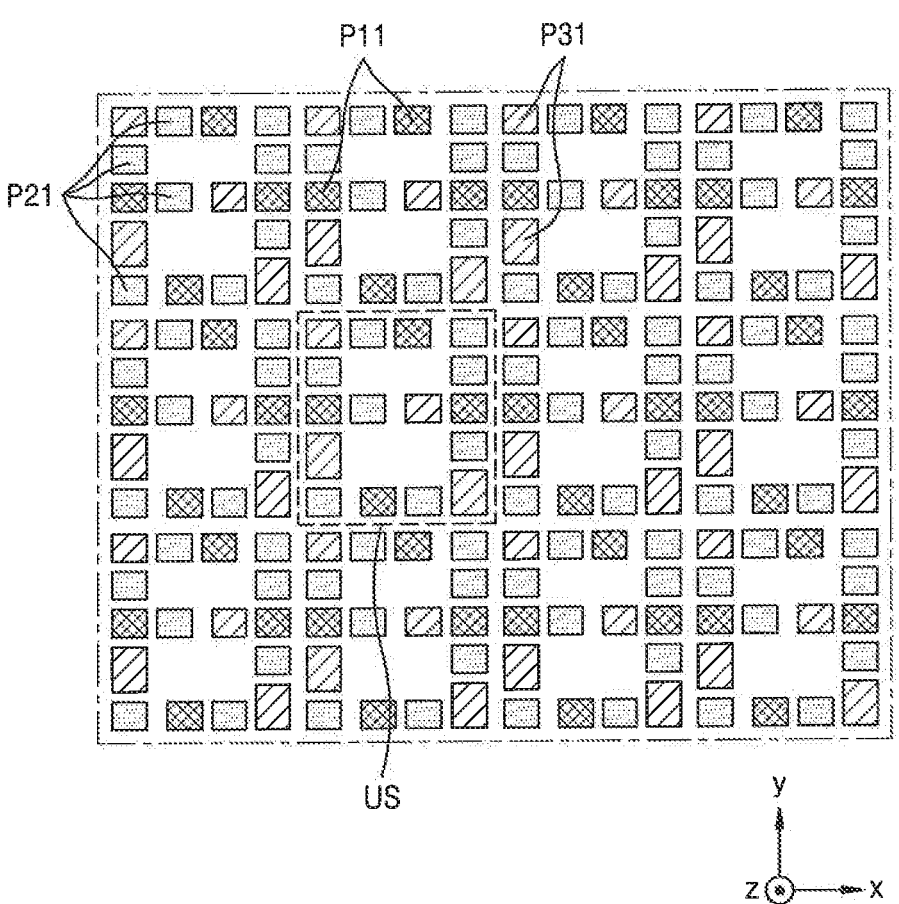

FIG. 28 is a schematic conceptual view of an arrangement of pixels of the display apparatus, according to an embodiment. An arrangement of pixels of the display apparatus according to an embodiment described above with reference to FIG. 27 may be modified as shown in FIG. 28. As described above, a unit set US may include an "F"-shaped portion, and a vertically inverted "F"-shaped portion symmetrical to each other with respect to a first direction (+y direction). In this embodiment, a position of a shorter side in the inverted "F"-shaped portion may be matched to a position of a shorter side in the "F"-shaped portion in the first direction (+y direction). To this end, the area of some pixels may be adjusted.

Figure 29:
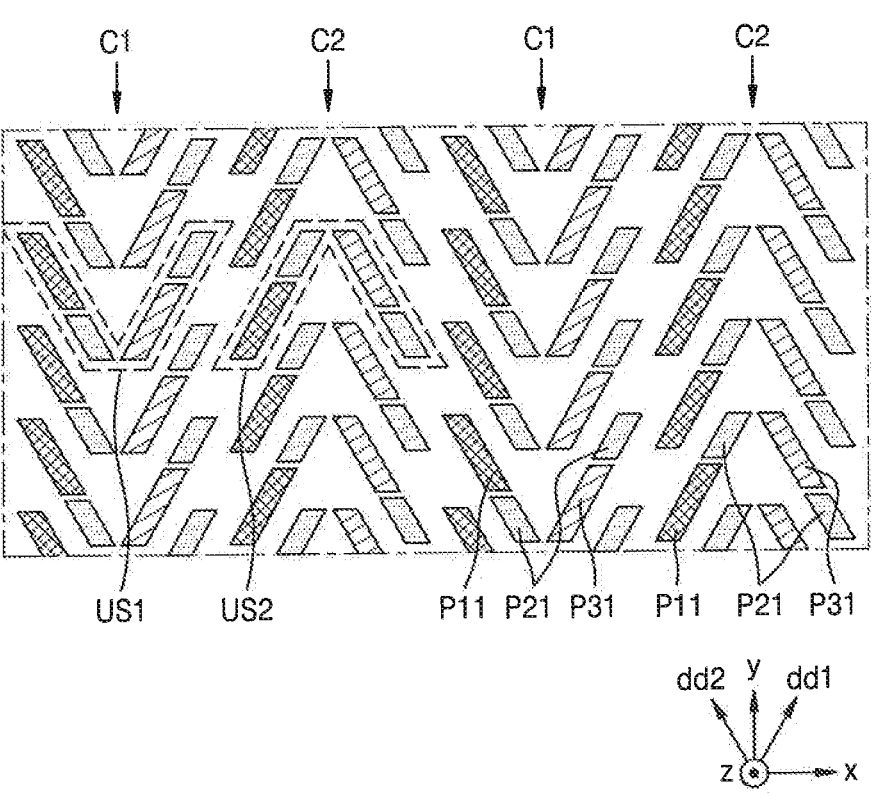

FIG. 29 is a schematic conceptual view of an arrangement of pixels of the display apparatus, according to an embodiment. When viewed from a direction perpendicular to a substrate, the display apparatus according to an embodiment of FIG. 29 may include a first unit set US1 having a substantially V shape, and a second unit set US2 having a vertically inverted "V" shape with respect to a first direction (+y direction). First unit sets US1 may be positioned along a first column C1 extending in the first direction (+y direction), and similarly, second unit sets US2 may be positioned along a second column C2 extending in the first direction (+y direction). The first column C1 and the second column C2 may be alternately positioned in a second direction (+x direction).

The first unit set US1 may include a first prong extending in a third direction (+dd1 direction) between the first direction (+y direction) and the second direction (+x direction), and a second prong extending in a fourth direction (+dd2 direction) between the first direction (+y direction) and an opposite direction (−x direction) to the second direction. The first prong may include a second pixel P21 emitting second color light and a third pixel P31 emitting third color light. The second prong may include a first pixel P11 emitting first color light and a second pixel P21 emitting the second color light. In an embodiment, since two second pixels P21 exist in the first unit set US1, the area of each of the first pixel P11 and the third pixel P31 may be greater than the area of one second pixel P21.

The second unit set US2 may include a third prong extending in the third direction (+dd1 direction) between the first direction (+y direction) and the second direction (+x direction), and a fourth prong extending in the fourth direction (+dd2 direction) between the first direction (+y direction) and the opposite direction (−x direction) to the second direction. The third prong may be adjacent to the first prong of the first unit set US1, and the fourth prong may be adjacent to the second prong of the first unit set US1.

The third prong may include a first pixel P11 emitting the first color light and a second pixel P21 emitting the second color light. The fourth prong may include a third pixel P31 emitting the third color light and a second pixel P21 emitting the second color light. In an embodiment, since two second pixels P21 exist in the second unit set US2, the area of each of the first pixel P11 and the third pixel P31 may be greater than the area of one second pixel P21.

Figure 30:
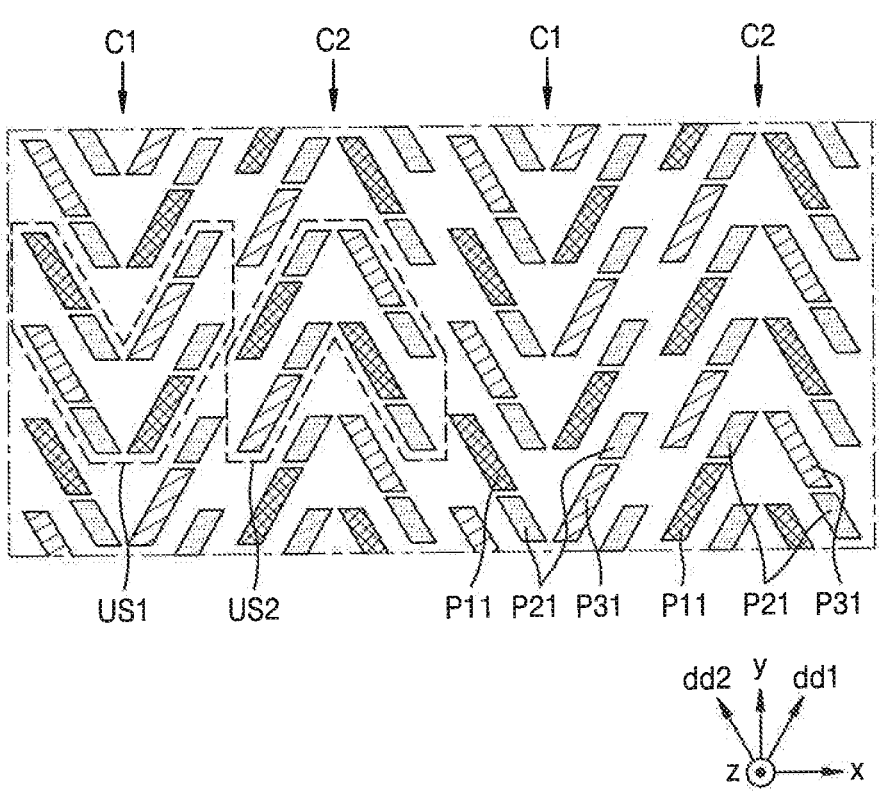

FIG. 30 is a schematic conceptual view of an arrangement of pixels of the display apparatus, according to an embodiment.

When viewed from a direction perpendicular to a substrate, the display apparatus according to an embodiment of FIG. 30 may include a first unit set US1 having a substantially V shape, and a second unit set US2 having a vertically inverted "V" shape with respect to a first direction (+y direction). First unit sets US1 may be positioned along a first column C1 extending in the first direction (+y direction), and similarly, second unit sets US2 may be positioned along a second column C2 extending in the first direction (+y direction). The first column C1 and the second column C2 may be alternately positioned along a second direction (+x direction).

The first unit set US1 having a substantially "V" shape may include two "V"-shaped portions. The two "V"-shaped portions may be arranged in the first direction (+y direction). One of the two "V"-shaped portions may include a first prong extending in a third direction (+dd1 direction) between the first direction (+y direction) and the second direction (+x direction), and a second prong extending in a fourth direction (+dd2 direction) between the first direction (+y direction) and an opposite direction (−x direction) to the second direction.

The first prong may include a second pixel P21 emitting second color light and a third pixel P31 emitting third color light. The second prong may include a first pixel P11 emitting first color light and a second pixel P21 emitting the second color light. The other of the two "V"-shaped portions may also include a third prong extending in the third direction (+dd1 direction) between the first direction (+y direction) and the second direction (+x direction), and a fourth prong extending in the fourth direction (+dd2 direction) between the first direction (+y direction) and the opposite direction (−x direction) to the second direction. The third prong may include a first pixel P11 emitting the first color light and a second pixel P21 emitting the second color light. The fourth prong may include a second pixel P21 emitting the second color light and a third pixel P31 emitting the third color light. In an embodiment, since two first pixels P11 and two third pixels P31 exist in the first unit set US1, whereas four second pixels P21 exist in the first unit set US1, the area of each of the first pixel P11 and the third pixel P31 may be greater than the area of one second pixel P21.

A second unit set US2 having a vertically inverted "V" shape with respect to the first direction (+y direction) may include two vertically inverted "V"-shaped portions. The two vertically inverted "V"-shaped portions may be arranged in the first direction (+y direction). One of the two "V"-shaped portions may include a fifth prong extending in the third direction (+dd1 direction) between the first direction (+y direction) and the second direction (+x direction), and a sixth prong extending in the fourth direction (+dd2 direction) between the first direction (+y direction) and the opposite direction (−x direction) to the second direction. The other of the two "V"-shaped portions may include a seventh prong extending in the third direction (+dd1 direction) between the first direction (+y direction) and the second direction (+x direction), and an eighth prong extending in the fourth direction (+dd2 direction) between the first direction (+y direction) and the opposite direction (−x direction) to the second direction. The fifth prong may be adjacent to the first prong of the first unit set US1, the sixth prong may be adjacent to the second prong of the first unit set US1, the seventh prong may be adjacent to the third prong of the first unit set US1, and the eighth prong may be adjacent to the fourth prong of the first unit set US1.

The fifth prong may include a second pixel P21 emitting the second color light and a third pixel P31 emitting the third color light. The sixth prong may include a first pixel P11 emitting the first color light and a second pixel P21 emitting the second color light. The seventh prong may include a first pixel P11 emitting the first color light and a second pixel P21 emitting the second color light. The eighth prong may include a second pixel P21 emitting the second color light and a third pixel P31 emitting the third color light. In an embodiment, since two first pixels P11 and two third pixels P31 exist in the second unit set US2, whereas four second pixels P21 exist in the second unit set US2, the area of each of the first pixel P11 and the third pixel P31 may be greater than the area of one second pixel P21.

Figure 31:
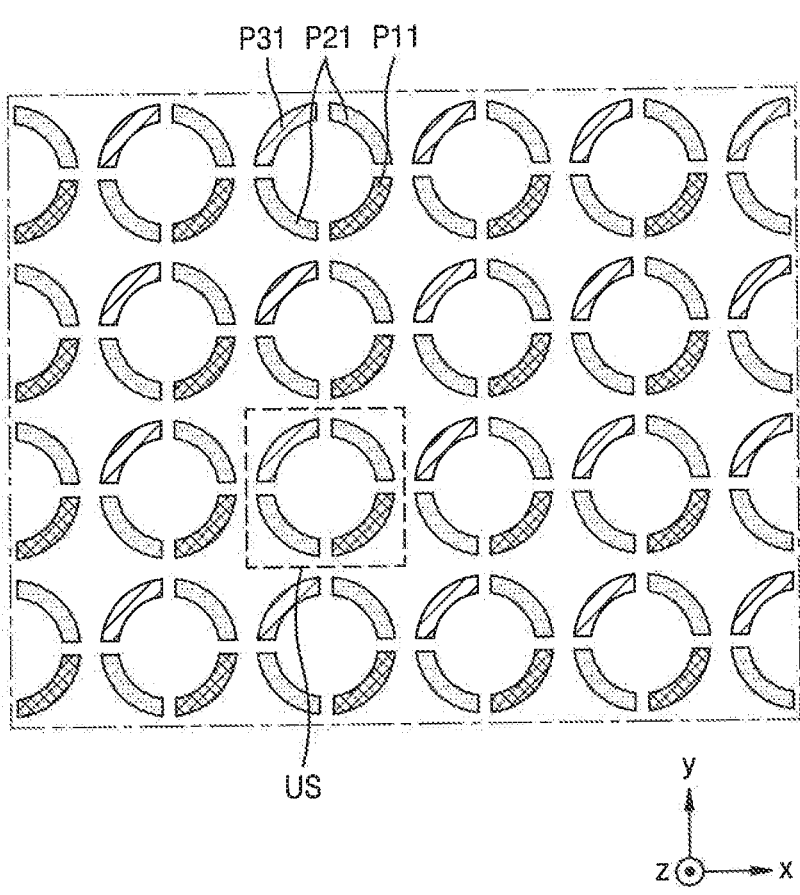

FIG. 31 is a schematic conceptual view of an arrangement of pixels of the display apparatus, according to an embodiment. When viewed from a direction perpendicular to a substrate, the display apparatus according to an embodiment of FIG. 31 may include a unit set US having a substantially "0" shape (e.g., circular shaped). Such unit sets US may be positioned at regular intervals in a first direction (+y direction) and a second direction (+x direction).

The unit set US having a substantially "0" shape may include four prongs separated at regular intervals. Each prong may substantially correspond to a shape of a sectoral arc having a central angle at a right angle. Each prong may represent a pixel. Accordingly, it is shown in FIG. 31 that the unit set US includes one first pixel P11, two second pixels P21, and one third pixel P31. The area occupied by each pixel may be variously modified. For example, in an embodiment, since two second pixels P21 exist in the unit set US, modifications may be made so that the area of each of the first pixel P11 and the third pixel P31 is greater than the area of one second pixel P21.

Figure 32:
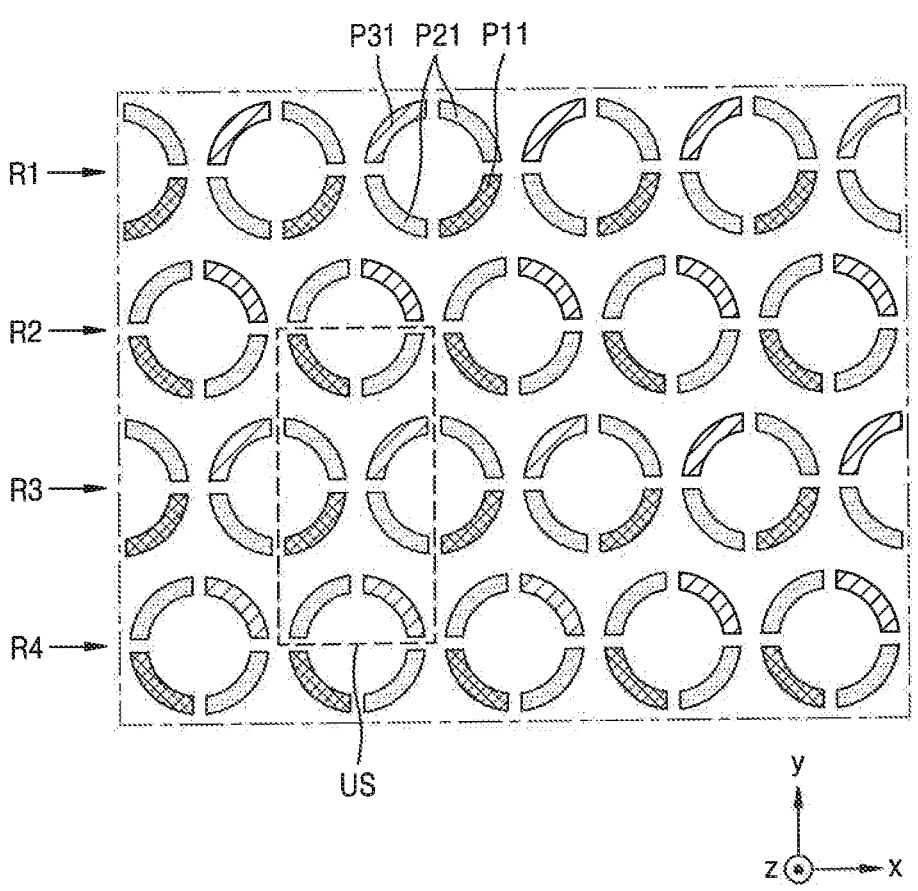

FIG. 32 is a schematic conceptual view of an arrangement of pixels of the display apparatus, according to an embodiment. When viewed from a direction perpendicular to a substrate, the display apparatus according to an embodiment of FIG. 32 may also include unit sets US positioned at regular intervals in a first direction (+y direction) and a second direction (+x direction). Each unit set US includes a plurality of prongs each substantially corresponding to a shape of a sectoral arc having a central angle at a right angle.

Two prongs are positioned at an end of the unit set US in the first direction (+y direction) and thus may form an open semicircular shape in the first direction (+y direction). The two prongs may include, for example, a first pixel P11 emitting first color light and a second pixel P21 emitting second color light. Two prongs are positioned at an end of the unit set US in an opposite direction (−y direction) to the first direction and thus may form an open semicircular shape in the opposite direction (−y direction) to the first direction. The two prongs may include, for example, a second pixel P21 emitting the second color light and a third pixel P31 emitting third color light. Four prongs are positioned at a central portion of the unit set US in the first direction (+y direction) and thus may form an open semicircular shape in the second direction (+x direction) and an open semicircular shape in an opposite direction (−x direction) to the second direction. Two prongs that form the open semicircular shape in the second direction (+x direction) may include, for example, a second pixel P21 emitting the second color light and a third pixel P31 emitting the third color light. Two prongs that form the open semicircular shape in the opposite direction (−x direction) to the second direction may include, for example, a first pixel P11 emitting the first color light and a second pixel P21 emitting the second color light.

Figure 33:
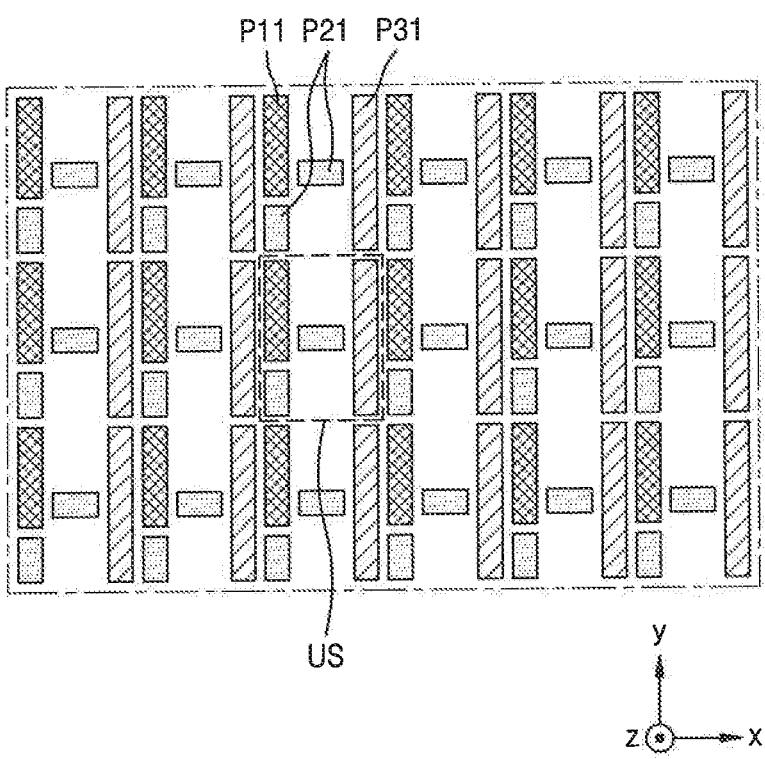

FIG. 33 is a schematic conceptual view of an arrangement of pixels of the display apparatus, according to an embodiment. When viewed from a direction perpendicular to a substrate, the display apparatus according to an embodiment of FIG. 33 may include a unit set US having a substantially "H" shape. Such unit sets US may be positioned at regular intervals in a first direction (+y direction) and a second direction (+x direction).

The unit set US having a substantially "H" shape may include two vertical prongs extending in the first direction (+y direction), and one horizontal prong positioned between the two vertical prongs and extending in the second direction (+x direction). One of the two vertical prongs may include a first pixel P11 that emits first color light and a second pixel P21 that emits second color light, and the other thereof may include a third pixel P31 that emits third color light. The horizontal prong may include a second pixel P21. In an embodiment, since two second pixels P21 exist in the unit set US, in the vertical prong including the first pixel P11 and the second pixel P21, the area of the first pixel P11 may be greater than the area of the second pixel P21.

Figure 34:
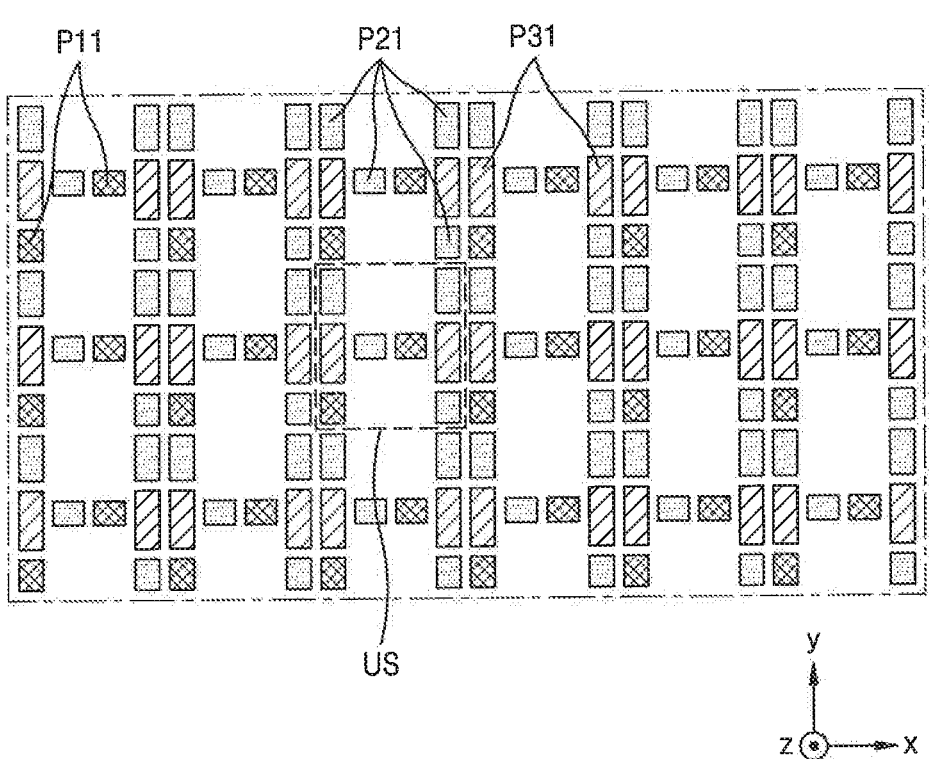

Each of the vertical prongs may also include a larger number of pixels. For example, as shown in FIG. 34 which is a schematic conceptual view of an arrangement of pixels of the display apparatus, according to an embodiment, one of two vertical prongs may include a first pixel P11 that emits first color light, a third pixel P31 that emits third color light, and a second pixel P21 that emits second color light, which are sequentially positioned in a first direction (+y direction), and the other thereof may include a second pixel P21 that emits the second color light, a third pixel P31 that emits the third color light, and a second pixel P21 that emits the second color light, which are sequentially positioned in the first direction (+y direction). A horizontal prong may include a first pixel P11 and a second pixel P21. In an embodiment, since two first pixels P11, two third pixels P31, and four second pixels P21 are positioned in a unit set US, the area of each of one first pixel P11 and one third pixel P31 may be greater than the area of one second pixel P21.

Figure 35:
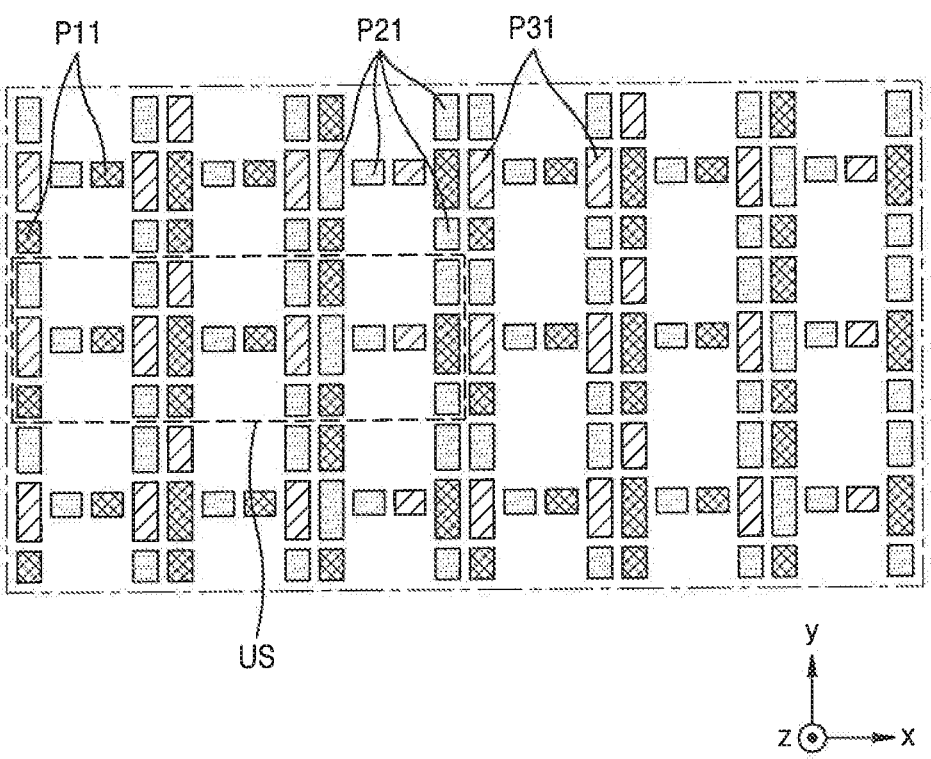

FIG. 35 is a schematic conceptual view of an arrangement of pixels of the display apparatus, according to an embodiment. A unit set US included in the display apparatus according to an embodiment of FIG. 35 includes three sets arranged in a second direction (+x direction), and each set includes an "H"-shaped portion.

A first set among the three sets may have the same configuration as the unit set US included in the display apparatus according to an embodiment described above with reference to FIG. 34. Unlike the first set, in a second set among the three sets, one of two vertical prongs may include two first pixels P11 that emit first color light and a third pixel P31 that emit third color light, which are sequentially positioned in a first direction (+y direction), and the other thereof may include a second pixel P21 that emits second color light, a third pixel P31 that emits the third color light, and a second pixel P21 that emits the second color light, which are sequentially positioned in the first direction (+y direction). In a third set among the three sets, one of two vertical prongs may include a first pixel P11 that emits the first color light, a second pixel P21 that emits the second color light, and a first pixel P11 that emits the first color light, which are sequentially positioned in the first direction (+y direction), and the other thereof may include a second pixel P21 that emits the second color light, a first pixel P11 that emits the first color light, and a second pixel P21 that emits the second color light, which are sequentially positioned in the first direction (+y direction). In addition, a horizontal prong of the third set may include a second pixel P21 and a third pixel P31.

Figure 36:
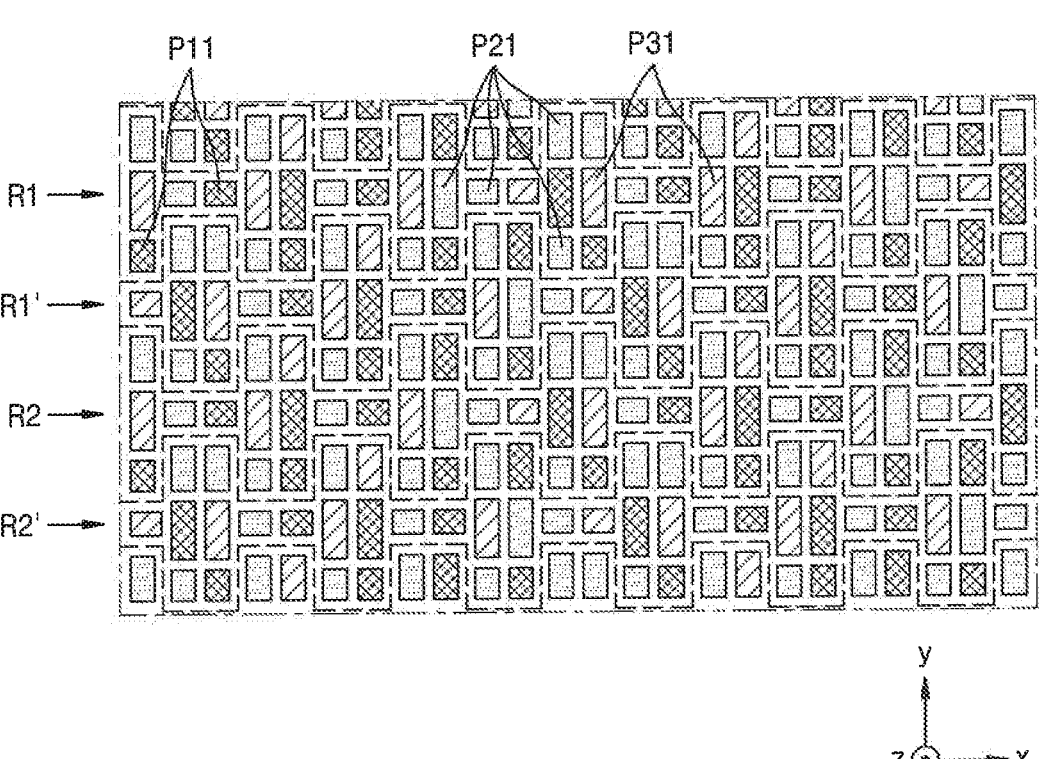

FIG. 36 is a schematic conceptual view of an arrangement of pixels of the display apparatus, according to an embodiment. In the display apparatus according to an embodiment of FIG. 36, a first row R1 and a second row R2, which extend in a second direction (+x direction), have the same configuration as the rows in the display apparatus according to an embodiment described with reference to FIG. 35. A first additional row R1' extending in the second direction (+x direction) and positioned between the first row R1 and the second row R2 has the same configuration as the first row R1, but has a configuration in which the first row R1 is shifted in parallel in the second direction (+x direction). Accordingly, vertical prongs of the first additional row R1' may be between vertical prongs of the first row R1 and the second row R2. Even in an embodiment of a second additional row R2' positioned in an opposite direction (−y direction) to the first direction from the second row R2, vertical prongs thereof are between the vertical prongs of the second row R2. Sets each including the first row R1, the first additional row R1', the second row R2, and the second additional row R2' are repeatedly positioned in a first direction (+y direction). Due to such an arrangement, the area of an empty space between the pixels may be significantly reduced, compared to the display apparatuses according to embodiments described above with reference to FIGS. 33 to 35.

According to the one or embodiments described above, a display apparatus may be implemented, in which an emission area may be increased and deposition efficiency may be increased during a manufacturing process. The scope of the disclosure is not necessarily limited to the above effects.

The disclosure has been described above with reference to non-limiting embodiments shown in the accompanying drawings, which are merely examples. Those of ordinary skill in the art can fully understand that various modifications and other equivalent embodiments may be made from such embodiments.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims.

What is claimed is:

1. A display apparatus comprising:

a plurality of first pixels each comprising a first pixel electrode and a first emission layer, the first emission layer is disposed over the first pixel electrode and emits a first color light;

a plurality of second pixels each comprising a second pixel electrode and a second emission layer, the second emission layer is disposed over the second pixel electrode and emits a second color light; and a plurality of third pixels each comprising a third pixel electrode and a third emission layer, the third emission layer is disposed over the third pixel electrode and emits a third color light, wherein the plurality of third pixels are positioned on grid points at regular intervals in a first direction and a second direction, the second direction is perpendicular to the first direction, the plurality of first pixels and the plurality of second pixels are disposed between the plurality of third pixels in inclined columns extending in a third direction at an angle of 45° from the first direction, wherein the plurality of first pixels are arranged in a first inclined column of the inclined columns and the plurality of second pixels are arranged are in a second inclined column of the inclined columns, the first and second inclined columns are alternately arranged, and two first pixels are disposed between adjacent third pixels in each of the first inclined columns, and two second pixels are disposed between adjacent third pixels in each of the second inclined columns.

2. The display apparatus of claim 1, wherein the two first pixels are arranged in a fourth direction perpendicular to the third direction, and the two second pixels are arranged in the third direction.

3. The display apparatus of claim 2, wherein the first emission layer is integrally formed as a single body in the two first pixels, and the second emission layer is integrally formed as a single body in the two second pixels.

4. The display apparatus of claim 2, wherein an area of each of the plurality of third pixels is about twice an area of each of the plurality of first pixels.

5. The display apparatus of claim 2, wherein an area of each of the plurality of third pixels is about twice an area of each of the plurality of second pixels.

* * * * *